United States Patent
Onodera et al.

(10) Patent No.: US 9,899,993 B2
(45) Date of Patent: Feb. 20, 2018

(54) RECONFIGURABLE DELAY CIRCUIT, DELAY MONITOR CIRCUIT USING SAID DELAY CIRCUIT, VARIATION COMPENSATION CIRCUIT, VARIATION MEASUREMENT METHOD, AND VARIATION COMPENSATION METHOD

(71) Applicant: JAPAN SCIENCE AND TECHNOLOGY AGENCY, Saitama (JP)

(72) Inventors: Hidetoshi Onodera, Kyoto (JP); Islam A. K. M Mahfuzul, Kyoto (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

(21) Appl. No.: 14/913,309

(22) PCT Filed: Jul. 29, 2014

(86) PCT No.: PCT/JP2014/069976
§ 371 (c)(1),
(2) Date: Feb. 19, 2016

(87) PCT Pub. No.: WO2015/025682
PCT Pub. Date: Feb. 26, 2015

(65) Prior Publication Data
US 2016/0211836 A1 Jul. 21, 2016

(30) Foreign Application Priority Data
Aug. 19, 2013 (JP) .................................. 2013-169965

(51) Int. Cl.
*H03K 5/134* (2014.01)
*G01R 31/28* (2006.01)
*H03K 5/00* (2006.01)

(52) U.S. Cl.
CPC .......... *H03K 5/134* (2014.07); *G01R 31/2882* (2013.01); *H03K 2005/00019* (2013.01)

(58) Field of Classification Search
CPC .................... H03K 5/134; H03K 5/14; H03K 2005/00019; H03K 2005/00058; H03K 2005/00065; G01R 31/2882
See application file for complete search history.

(56) References Cited

U.S. PATENT DOCUMENTS 4,982,353 A * 1/1991 Jacob ........................ G06F 7/62
327/146
5,055,706 A * 10/1991 Nakai ................... H03K 5/1252
326/21

(Continued)

FOREIGN PATENT DOCUMENTS

JP 05-014149 A 1/1993
JP 09-167927 A 6/1997

(Continued)

OTHER PUBLICATIONS

Mahfuzul et al.; "Variation-Sensitive Monitor Circuits for Estimation of Global Process Parameter Variation"; IEEE Transactions on Semiconductor Manufacturing; vol. 25 No. 4; Nov. 2012; p. 571-580.

(Continued)

*Primary Examiner* — Thomas J Hiltunen
(74) *Attorney, Agent, or Firm* — Baker & Hostetler LLP

(57) ABSTRACT

A delay circuit contains a first inversion circuit including a pull-up circuit and a pull-down circuit, and a second inversion circuit including a pull-up circuit and a pull-down circuit. The delay circuit further contains a first pass transistor connected in series to the pull-up circuit in the first inversion circuit between a power supply potential and an output node, a second pass transistor connected in series to the pull-down circuit in the first inversion circuit between a (Continued)

ground potential and the output node, a third pass transistor connected in series between the input node and the pull-up circuit in the second inversion circuit, and a fourth pass transistor connected in series between the input node and the pull-down circuit in the second inversion circuit. A delay characteristic of the delay circuit is changed by a combination of control signals applied to gates of the pass transistors.

20 Claims, 16 Drawing Sheets

(56) References Cited

U.S. PATENT DOCUMENTS

| | | | |
|---|---|---|---|
| 5,227,679 A * | 7/1993 | Woo | H03K 5/133 326/121 |
| 5,440,260 A | 8/1995 | Hayashi et al. | |
| 5,811,992 A * | 9/1998 | D'Souza | H03K 19/0963 326/31 |
| 6,087,886 A * | 7/2000 | Ko | H03K 3/037 327/407 |
| 6,124,747 A | 9/2000 | Nasu | |
| 6,166,577 A | 12/2000 | Mizuno et al. | |
| 6,169,436 B1 * | 1/2001 | Marbot | H03K 5/133 327/269 |
| 6,356,132 B1 * | 3/2002 | Mastrocola | H03K 5/133 327/269 |
| 6,362,656 B2 * | 3/2002 | Rhee | G11C 7/1051 326/82 |
| 6,417,714 B1 * | 7/2002 | Biyabani | H03K 3/3565 327/158 |
| 6,441,665 B1 * | 8/2002 | Hashidate | G06F 1/10 327/161 |
| 6,466,063 B2 | 10/2002 | Chen | |
| 6,549,052 B2 * | 4/2003 | Okayasu | H03K 5/133 327/276 |
| 6,650,190 B2 * | 11/2003 | Jordan | H03K 3/0315 331/17 |
| 7,035,148 B2 * | 4/2006 | Chung | G11C 7/1051 326/87 |
| 7,102,407 B2 | 9/2006 | Slawecki | |
| 7,292,086 B2 * | 11/2007 | Onodera | H03K 5/15066 327/261 |
| 7,394,300 B2 * | 7/2008 | Chae | H03H 11/26 327/261 |
| 7,446,581 B2 * | 11/2008 | Ishii | H03K 3/0375 327/210 |
| 7,492,204 B1 | 2/2009 | Lin et al. | |
| 7,898,288 B2 | 3/2011 | Wong | |
| 8,102,190 B2 * | 1/2012 | Masleid | H03K 17/005 326/113 |
| 8,395,406 B2 * | 3/2013 | Iwashita | G01R 31/317 324/750.3 |
| 8,896,358 B2 * | 11/2014 | Hood | H03K 5/13 327/231 |
| 9,356,589 B2 * | 5/2016 | Ebuchi | G06F 13/4282 |
| 2003/0057775 A1 * | 3/2003 | Yamashita | H03K 17/164 307/43 |
| 2003/0071691 A1 | 4/2003 | Boerstler et al. | |
| 2006/0164153 A1 | 7/2006 | Yamashida | |
| 2007/0046354 A1 * | 3/2007 | Kuroki | H03H 11/265 327/261 |
| 2009/0309642 A1 | 12/2009 | Kim | |
| 2010/0079212 A1 | 4/2010 | Sugiyama | |
| 2011/0006851 A1 * | 1/2011 | Kim | H03K 5/133 331/57 |
| 2014/0232438 A1 * | 8/2014 | Miyano | H03L 7/0814 327/161 |

FOREIGN PATENT DOCUMENTS

| | | |
|---|---|---|
| JP | 2001-044369 A | 2/2001 |
| JP | 2006-211064 A | 8/2006 |
| JP | 2010-087968 A | 4/2010 |
| JP | 2012-156203 A | 8/2012 |
| JP | 2013-012969 A | 1/2013 |
| WO | WO 99/12263 A1 | 3/1999 |

OTHER PUBLICATIONS

Fujimoto et al.; "Inhomogeneous Ring Oscillator for WID Variability and RTN Characterization"; Proc. 25th IEEE Int'l Conference on Microelectronic Test Structures; Mar. 2012; p. 25-30.
Fujimoto et al.; "Inhomogeneous Ring Oscillator for Within-Die Variability and RTN Characterization" IEEE Transactions on Semiconductor Manufacturing; vol. 26 No. 3; Aug. 2013; p. 296-305.
Higuchi et al.; "Extracting Device-Parameter Variations Using a Single Sensitivity-Configurable Ring Oscillator"; 18th IEEE European Test Symposium (ETS); 2013; 6 pages.
Mahfuzul et al.; "Reconfigurable Delay Monitor Circuit for Evaluating Die-to-Die and Within-Die Process Variations"; Dept. of Communications and Computer Engineering; Kyoto University; 6 pages; Abstract Only.
International Patent Application No. PCT/JP2014/069976; Int'l Preliminary Report on Patentability; dated Feb. 23, 2016; 5 pages.
European Patent Application No. 14838727.7; Extended Search Report; dated Jul. 12, 2017; 18 pages.

* cited by examiner

Fig.10A OUTPUT OF PULSE GENERATOR
Fig.10B OUTPUT OF DELAY MONITOR CIRCUIT
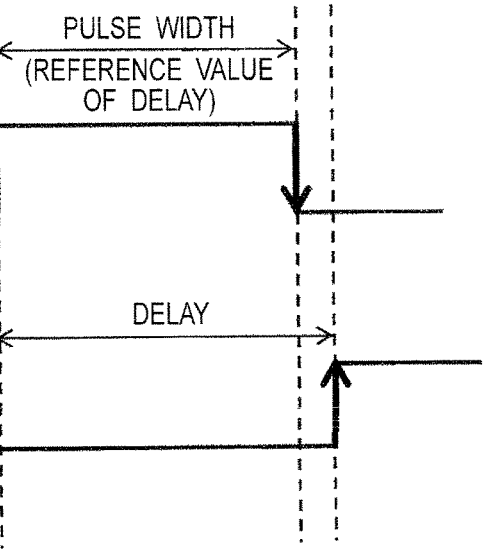
Fig.11
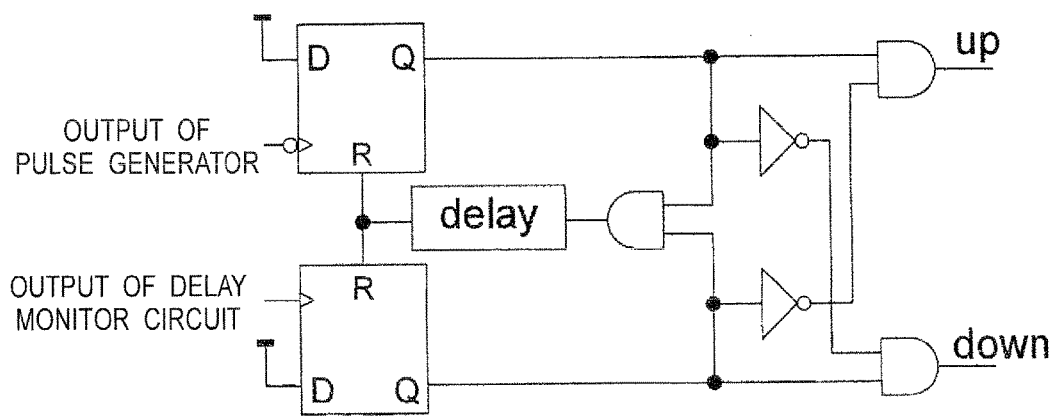

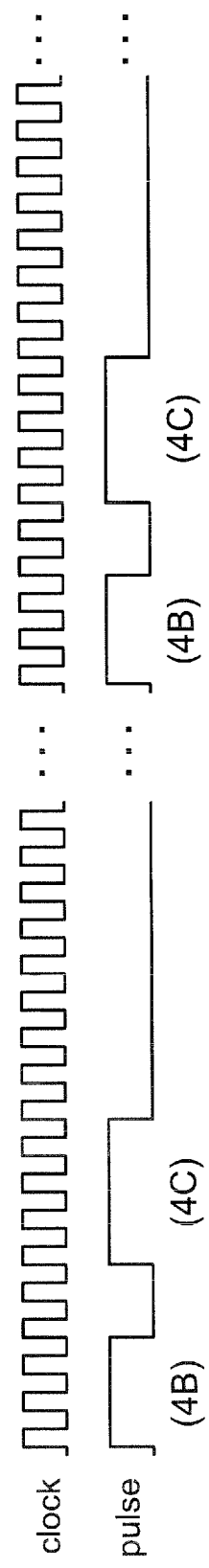

RECONFIGURABLE DELAY CIRCUIT, DELAY MONITOR CIRCUIT USING SAID DELAY CIRCUIT, VARIATION COMPENSATION CIRCUIT, VARIATION MEASUREMENT METHOD, AND VARIATION COMPENSATION METHOD

CROSS-REFERENCE TO RELATED APPLICATIONS

This application is the National Stage of International Application No. PCT/JP2014/069976, filed Jul. 29, 2014, which claims benefit of Japanese Patent Application No. 2013-169965, filed Aug. 19, 2013, the disclosures of which are incorporated herein by reference in their entireties.

Technical Field

The present invention relates to a delay monitor circuit for measuring signal transmission time for an operating integrated circuit on a chip, and a reconfigurable delay circuit usable therein. Further, the present invention relates to a circuit and method for measuring and compensating variations in transistors in an integrated circuit.

Background Art

Along with miniaturization of integrated circuits, variations in characteristics of transistors have been increased. The variations in their characteristics are broadly categorized into inter-chip variation component which causes uniform fluctuations of characteristics of transistors in a chips and on-chip variation component which causes independent fluctuations of characteristics of respective transistors. Such variations of transistor characteristics induce variations of signal transmission times in integrated circuits. In order to operate an integrated circuit with lowest possible energy consumption, there have been employed methods for compensating amounts of characteristic variations, by adjusting clock frequencies and power supply voltages to proper values or by adjusting voltages applied to transistor substrates, according to variations in transistor characteristics. In order to attain such adjustments, it is necessary to evaluate amounts of variations in characteristics of nMOS transistors and characteristics of pMOS transistors. For this purpose, a delay monitor circuit composed of plural delay circuits connected in series (refer to Patent Document 1, Non-Patent Document 1, and the like).

FIGS. 18A-18C show examples of conventional delay circuits used in a delay monitor circuit, which are disclosed in Non-Patent Document 1. The delay circuit as shown in FIG. 18A is an ordinary inversion logic gate (inverter) which has delay characteristics determined by both the characteristics of the nMOS transistor and the pMOS transistor. The delay circuit as shown in FIG. 18B has a configuration having an nMOS pass transistor inserted to the gate of the nMOS transistor, and delay characteristics thereof are strongly influenced by the characteristics of the nMOS transistors. The delay circuit as shown in FIG. 18C has a configuration having a pMOS pass transistor inserted to the gate of the pMOS transistor, and delay characteristics thereof are strongly influenced by the characteristics of the pMOS transistors.

Factors of variations in characteristics of transistors include threshold voltages and channel lengths. Here, regarding the delay circuits as shown in FIGS. 18A to 18C, amount of fluctuation of the delay time with respect to amount ΔVthn of fluctuation of threshold voltage of nMOS transistor, and with respect to the amount ΔVthp of fluctuation of the threshold voltage of the pMOS transistor are determined, assuming that the amount ΔL of fluctuation of channel length is zero. It results in characteristics as shown in FIG. 19. In FIG. 19, solid lines A, B and C represent the characteristics relating to the delay circuits as shown in FIGS. 18A, 18B and 18C, respectively. In the case of the delay circuit in FIG. 18A, ΔVthn and ΔVthp influence the delay time to the same extent. In the case of the delay circuit in FIG. 18B, ΔVthn mainly influences the delay time. In the case of the delay circuit in FIG. 18C, ΔVthp mainly influences the delay time.

The delay monitor circuit is composed of a ring oscillation circuit constituted by the delay circuits connected in series to each other in a number of stages which causes no logic inversion. The oscillation frequency of this circuit is determined by the delay times in the respective delay circuits.

Factors for determining an oscillation frequency of the delay monitor circuit composed of delay circuits which are all constituted by only either one of the circuits as shown in FIGS. 18A to 18C can be approximated with ΔL, ΔVthn and ΔVthp for FIG. 18A, ΔL and ΔVthn for FIG. 18B, and ΔL and ΔVthp for FIG. 18C. The on-chip variation components of ΔL, ΔVthn and ΔVthp are induced at random. Therefore, the influences of the on-chip variations are cancelled with each other, and do not appear in a signal transmission delay time caused by transmission of signals through the delay circuits of the same type in the plural stages, while the influences of the inter-chip variations induced commonly among all the delay circuits appear therein. Accordingly, from the oscillation frequencies of the three types of the delay monitor circuits which are each composed of delay circuits which are all constituted by only either one of the circuits as shown in FIGS. 18A to 18C, it is possible to extract the amount of inter-chip variation in amount of fluctuation of the threshold voltages of the nMOS transistors, in amount of fluctuation of the threshold voltages of the pMOS transistors, and in amount of fluctuation of the channel lengths of both the nMOS and pMOS transistors.

Since the on-chip variation is phenomena induced at random, by preparing a statistically-meaningful number of delay monitor circuits, it is possible to extract the amounts of on-chip variations, from the amount of variation in the oscillation frequencies of these delay monitor circuits. In order to improve the accuracy of the estimated amount of variation, it is necessary to prepare a large number of delay monitor circuits, which increases the chip area allotted for these delay monitor circuits.

PRIOR-ART DOCUMENTS

Patent Documents

Patent Document 1: JP2001-44369A
Patent Document 2: WO99/12263

Non-Patent Documents

Non-Patent Document 1: Islam A. K. M. Mahfuzul, Akira Tsuchiya, Kazutoshi Kobayashi, Hidetoshi Onodera, "Variation-sensitive Monitor Circuits for Estimation of Global Process Parameter Variation," IEEE, Trans. Semiconductor Manufacturing, vol 25, no 4, pp. 571-580, 2012/12.

Non-Patent Document 2: Shuichi Fujimoto, Takashi Matsumoto and Hidetoshi Onodera, "Inhomogeneous Ring Oscillator for WID Variability and RTN Characterization," Proc. 25th IEEE International Conference on Microelectronic Test Structures, pp. 25-30, 2012/03.

SUMMARY OF INVENTION

Problems to be Solved by the Invention

As described above, in cases where a delay monitor is composed of conventional delay circuits, in order to estimate amounts of inter-chip variations, which are factors of variations in transistor characteristics, it is necessary to prepare delay monitor circuits having different delay characteristics, the number of the delay monitor circuits being at least equal to or more than the number of the factors. Further, in order to estimate statistic amounts of on-chip variations, it is necessary to prepare a larger number of delay monitor circuits.

Namely, in order to evaluate inter-chip variations and on-chip variations in transistors, with delay monitor circuits employing conventional delay circuits, a large number of delay monitor circuits are required. The chip area is increased depending on the number of the necessary delay monitor circuits, and thus there is a problem of increased chip manufacturing costs.

The present invention has been made in order to overcome the aforementioned problem and aims at providing a delay circuit for use in a delay monitor circuit for measuring, on a chip, a signal transmission time in operating integrated circuit which enables suppression of increase of a chip area for the delay monitor circuit and reduction of the manufacturing cost.

Means for Solving the Problem

A first aspect of the present invention provides a reconfigurable delay circuit that is included in a delay monitor circuit for measuring a delay in a signal transmission time in an integrated circuit. The delay circuit includes an input node for inputting an input signal, an output node for outputting an output signal, a first inversion circuit, and a second inversion circuit. The first inversion circuit includes a serial circuit which contains a pull-up circuit adapted to connect a power supply potential to the output node when being turned on based on the input signal, and a pull-down circuit adapted to connect a ground potential to the output node when being turned on based on the input signal. The second inversion circuit includes a serial circuit which contains a pull-up circuit adapted to connect the power supply potential to the output node when being turned on based on the input signal, and a pull-down circuit adapted to connect the ground potential to the output node when being turned on based on the input signal. The delay circuit further includes a first pass transistor connected in series to the pull-up circuit in the first inversion circuit between the power supply potential and the output node, a second pass transistor connected in series to the pull-down circuit in the first inversion logic circuit, between the ground potential and the output node, a third pass transistor connected in series between the input node and an input of the pull-up circuit in the second inversion circuit, and a fourth pass transistor connected in series between the input node and an input of the pull-down circuit in the second inversion circuit. A delay characteristic of the reconfigurable delay circuit is changed by a combination of control signals applied to gates of the first to fourth pass transistors.

With the aforementioned configuration, it is possible to realize circuit configurations having various delay characteristics, with a single delay circuit. For example, by making the pull-up circuits and the third pass transistor from pMOS transistors and by making the pull-down circuits and the fourth pass transistor from nMOS transistors, it is possible to realize, with a single delay circuit, 1) a circuit having a delay characteristic of a normal inversion logic gate (inverter), 2) a circuit having a delay characteristic which is strongly influenced by characteristics of the nMOS transistors, and 3) a circuit having a delay characteristic which is strongly influenced by characteristics of the pMOS transistors.

A second aspect of the present invention provides a delay monitor circuit for measuring a delay in a signal transmission time in an integrated circuit. The delay monitor circuit includes a circuit including multiple above described delay circuits which are connected in series to each other in multiple stages. With this delay monitor circuit, it is possible to measure various delay characteristics with a single delay monitor circuit, thus eliminating the necessity of providing a large number of delay monitor circuits. This can suppress increases of the chip area, thereby reducing the manufacturing cost.

A third aspect of the present invention provides a method for measuring a variation in characteristics of circuit elements in an integrated circuit (in as semiconductor chip) using the above described delay monitor circuit. The measuring method includes a first step of setting the control signals for each stage in such a way as to make the delay circuit in a specific stage have a configuration different from configurations of the delay circuits in the other stages than the specific stage, and applying the set control signals to the pass transistors, a second step of measuring an output of the delay monitor circuit with the control signals being applied to the pass transistors, a third step of repeating the first step and the second step while sequentially shifting the specific stage, and a fourth step of measuring a variation in the characteristics of the circuit elements in a chip on which the integrated circuit is formed, based on a result of the measurement obtained in the third step. With the aforementioned method, it is possible to evaluate variations in transistors in a semiconductor chip.

A fourth aspect of the present invention provides a method for measuring a variation in characteristics of circuit elements among semiconductor chips on each of which an integrated circuit is formed. The method includes a first step of setting the control signals for each stage in such a way as to make the delay circuits in all the stages have the same configuration and applying the set control signals to the pass transistors, a second step of measuring an output of the delay monitor circuit with the control signals being applied to the pass transistors, and a third step of measuring a variation in the characteristics of the circuit elements, among the chips on each of which the integrated circuit is formed, based on a result of the measurement obtained in the second step. With the aforementioned method, it is possible to evaluate variations in transistors among semiconductor chips.

Further, in the delay monitor circuit, at least a fifth pass transistor may be connected in parallel to the third pass transistor, and at least a sixth pass transistor may be connected in parallel to the fourth pass transistor. With this configuration, it is possible to evaluate variations in the third and fourth pass transistors, in the transistor-by-transistor basis. For this delay monitor circuit, the variation measuring methods in fifth and sixth aspects of the present invention are provided.

The variation measuring method in the fifth aspect includes a first step of setting the control signals for each stage in such a way as to make the delay circuit in a specific stage have a configuration different from configurations of the delay circuits in the other stages than the specific stage, and applying the set control signals to the pass transistors, a second step of measuring an output of the delay monitor circuit, with the control signals being applied to the pass transistors, a third step of repeating the first step and the second step, while sequentially shifting the specific stage, and a fourth step of measuring a variation in the characteristics of the circuit elements in the chip on which the integrated circuit is formed, based on a result of the measurement obtained in the third step. The second step includes a fifth step of turning on the third pass transistor while turning off the fifth transistor, and measuring an output of the delay monitor circuit, for the specific stage, a sixth step of turning off the third pass transistor while turning on the fifth pass transistor, and measuring the output of the delay monitor circuit, for the specific stage, and a seventh step of calculating a difference between a result of the measurement in the fifth step and a result of the measurement in the sixth step. With the aforementioned variation determination method, it is possible to evaluate variations in transistors in a semiconductor chip, on the transistor-by-transistor basis.

The variation measuring method in the sixth aspect includes a first step of setting the control signals for each stage in such a way as to make the delay circuit in a specific stage have a configuration different from configurations of the delay circuits in the other stages than the specific stage, and applying the set control signals to the pass transistors, a second step of measuring an output of the delay monitor circuit, with the control signals being applied to the control signals to the pass transistors, a third step of repeating the first step and the second step, while sequentially shifting the specific stage, and a fourth step of measuring a variation in the characteristics of the circuit elements in a chip on which the integrated circuit is formed, based on a result of the measurement obtained in the third step. The second step includes a fifth step of turning on the fourth pass transistor while turning off the sixth transistor, and measuring an output of the delay monitor circuit, for the specific stage, a sixth step of turning off the fourth pass transistor while turning on the sixth pass transistor, and measuring the output of the delay monitor circuit, for the specific stage, and a step of calculating a difference between a result of the measurement in the fifth step and a result of the measurement in the sixth step. With the aforementioned variation determination method, it is possible to evaluate variations in transistors in a semiconductor chip, on the transistor-by-transistor basis.

A seventh aspect of the present invention provides a variation compensation circuit for compensating a variation in characteristics in circuit elements in an integrated circuit. The variation compensation circuit includes the delay monitor circuit in the second aspect, and a compensation circuit for compensating a variation in the characteristics of the circuit elements, based on a delay of signal transmission measured by the delay monitor circuit.

An eighth aspect of the present invention provides a variation compensation method including the steps of measuring a variation in characteristics of circuit elements in an integrated circuit using the fourth to sixth measuring methods, and compensating the characteristics of the circuit elements based on the measured variation.

Effects of the Invention

With the delay circuit according to the present invention, it is possible to make it to have various delay characteristics. Thus it is not necessary to prepare multiple delay monitor circuits according to delay characteristics which are desired to be measured, and it becomes possible to evaluate variations in transistors using a single delay monitor circuit. This results in suppression of increase of chip area, thereby realizing reduction of manufacturing cost.

BRIEF DESCRIPTION OF DRAWINGS

FIG. 4A shows a case where the logic values of signals C1, C2, C3 and C4 are (0, 1, 1, 0). FIG. 4B shows a case where the logic values of signals C1, C2, C3 and C4 are (0, 0, 1, 1). FIG. 4C shows a case where the logic values of signals C1, C2, C3 and C4 are (1, 1, 0, 0).

FIGS. 10A-10B are views explaining operation of a comparator circuit.

FIG. 11 is a view showing an example of the circuit configuration of the comparator circuit.

FIG. 12 is a view showing a pulse signal outputted from a pulse generator.

FIG. 14A shows a case where the equivalent circuit is reconfigured to be a standard inverter. FIG. 14B shows in a case where the equivalent circuit is reconfigured to be a configuration sensitive to nMOS transistors. FIG. 14C shows a case where the equivalent circuit is configured to be a configuration sensitive to pMOS transistors.

MODE FOR CARRYING OUT THE INVENTION

Hereinafter, with reference to the accompanying drawings, there will be described embodiments of delay monitor circuits according to the present invention, and delay circuits for use therein.

First Embodiment

1. Configurations 1.1 Delay Monitor Circuit

A delay monitor circuit as described later is a circuit adapted to measure delay time in signal transmission on a chip to detect variations of characteristics (threshold voltage, and the like) of transistors among chips or in a chip.

Figure 1A:
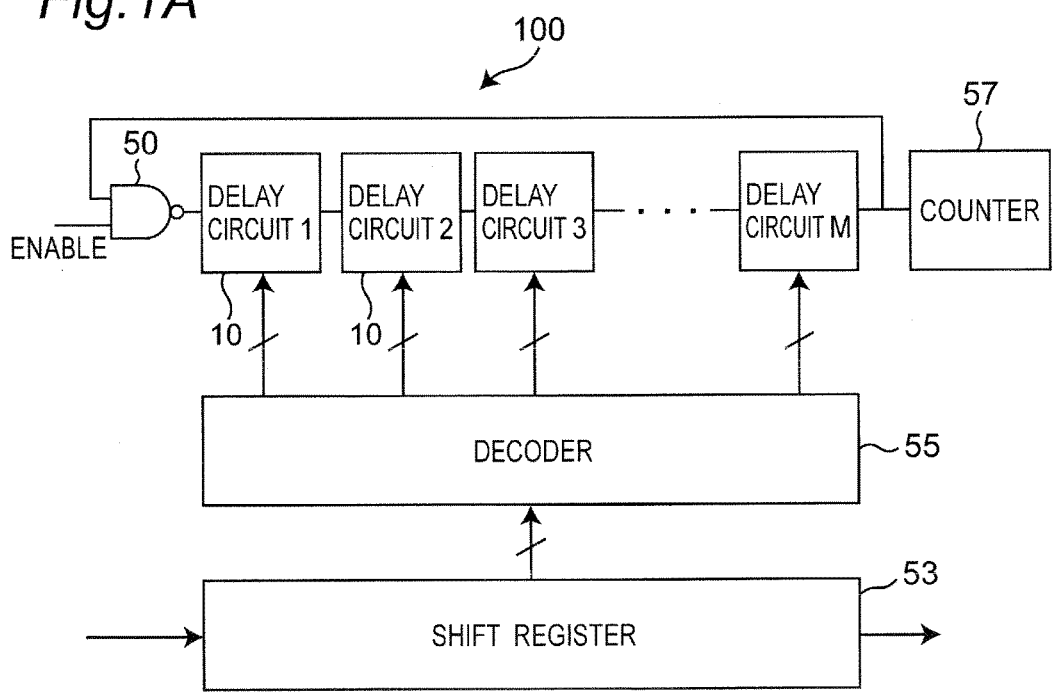
FIGS. 1A and 1B are views showing a configuration of an example of a delay monitor circuit according to the present invention.

FIG. 1A shows a configuration of a delay monitor circuit. As shown in the same figure, the delay monitor circuit 100 is a ring oscillation circuit composed of delay circuits 10 which are connected in series to each other in plural stages. In this case, each delay circuit 10 is an inverter circuit adapted to invert an input signal and to output the inverted input signal. Particularly, the delay circuit 10 of the present embodiment is configured to be reconfigurable such that the configuration thereof can be changed. The delay circuit 10 that is reconfigurable is described later in detail. The delay monitor circuit 100 includes a NAND gate 50 in the first stage, which can turn on and off oscillation in response to an Enable signal. The configurations of the respective delay circuits 10 in the delay monitor circuit 100 are changed by control signals from a shift register 53. The control signals from the shift register 53 are decoded by a decoder 55, and the decoded control signals are supplied to the delay circuits 10 in the respective stages. Hence, the configuration of the delay circuit 10 in each stage is set. The value of the shift register 53 is set by serial data and a clock signal. The serial interface provided in such a way can be integrated with a scanning interface for testing. The frequency (oscillation frequency) of the output of the delay monitor circuit 100 is measured by a counter 57 provided on or outside a chip.

Figure 1B:
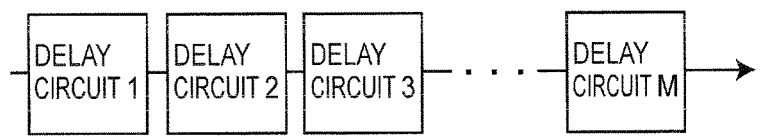

Further, in the present embodiment, the delay monitor circuit is composed of a ring oscillation circuit to measure a delay time in signal transmission on a chip with a frequency. However, the configuration of the delay monitor circuit is not limited thereto, and it can be also a circuit composed of delay circuits which are simply connected in series to each other in plural stages for creating delay signals, as shown in FIG. 1B. In this case, it is possible to measure delay time directly from output of the delay monitor circuit.

1.2 Delay Circuit

Figure 2:
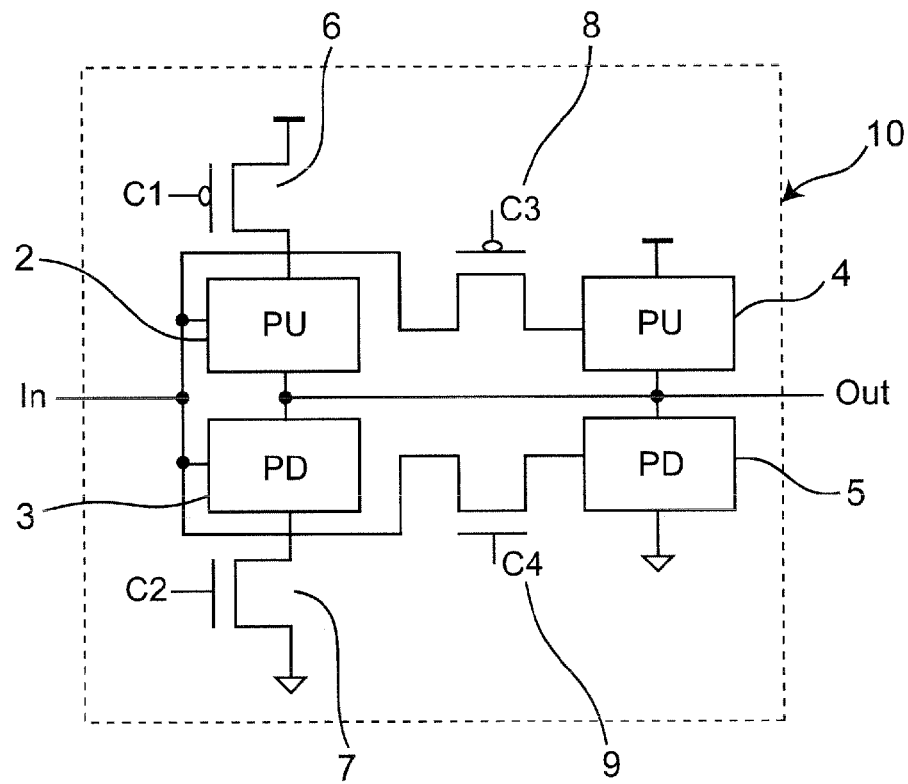
FIG. 2 is a view showing a configuration of a delay circuit composing a delay monitor circuit according to a first embodiment of the present invention.

FIG. 2 shows a configuration of the delay circuit 10 which is reconfigurable. The delay circuit 10 includes a first inversion logic gate including a serial circuit composed of a pull-up circuit 2 and a pull-down circuit 3, and a second inversion logic gate including a serial circuit composed of a pull-up circuit 4 and a pull-down circuit 5. A pMOS pass transistor 6 is connected in series to the pull-up circuit 2 in the first inversion logic circuit between the pull-up circuit 2 and a power-supply potential. An nMOS pass transistor 7 is connected in series to the pull-down circuit 3 in the first inversion logic circuit between the pull-down circuit 3 and a ground. In the respective signal input paths to the pull-up circuit 4 and the pull-down circuit 5 in the second inversion logic gate, a pMOS pass transistor 8 and an nMOS pass transistor 9 are inserted therein in series. Namely, the pMOS pass transistor 8 and the nMOS pass transistor 9 are respectively inserted in series between an input node of the delay circuit 10 and the respective control inputs of the pull-up circuit 4 and the pull-down circuit 5 in the second inversion logic gate. Changing the logic values of control signals (C1 to C4) applied to the gates of the respective pass transistors (the pass gates) 6 to 9 can realize different delay characteristics of the delay circuit 10.

As described above, the delay circuit 10 according to the present embodiment includes the two types of pull-up circuits and the two types of pull-down circuits, and can control their operations with the pass transistors 6 to 9. With the pass transistors 6 and 7 inserted in series in the first inversion logic gate, it is possible to independently turn on or off the pull-up circuit 2 and the pull-down circuit 3 in the first inversion logic gate. Further, with the pass transistors 8 and 9 inserted in series to the respective inputs of the second inversion logic gate, it is possible to control transmissions of signals to the second inversion logic gate. Further, since signal transmissions are performed through the pass transistors 8 and 9, the signals transmitted therethrough are decreased in magnitude by their threshold voltages.

With the aforementioned circuit configuration, it is possible to use, as a pull-up circuit, either one of the pull-up circuit 2 in the first inversion logic gate and the pull-up circuit 4 in the second inversion logic gate which is supplied with an input signal through the pMOS pass transistor 8. Further, it is possible to use, as a pull-down circuit, either one of the pull-down circuit 3 in the first inversion logic gate, and the pull-down circuit 5 in the second inversion logic gate which is supplied with an input signal through the nMOS pass transistor 9.

With the aforementioned circuit, by changing the logic values of the control signals C1 to C4 applied to the pass transistors 6 to 9, it is possible to realize different four types of delay characteristics. By connecting these delay circuits in series in M stages to form a delay monitor circuit, it is possible to measure transmission delay times in different delay paths of $4^M$ types.

Figure 3:
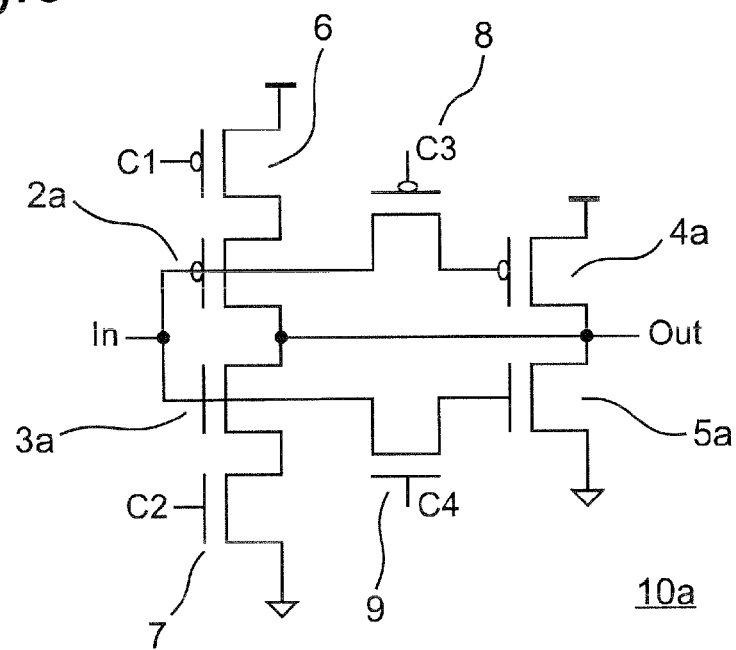
FIG. 3 is a view showing the more detailed configuration of the delay circuit according to the first embodiment.

FIG. 3 is a view showing a more concrete example of the configuration of the delay circuits as shown in FIG. 2. FIG. 3 shows a simplest configuration of the pull-up circuit and the pull-down circuit, in which the pull-up circuits 2 and 4 and the pull-down circuits 3 and 5 are each composed of a single pMOS transistor or a single nMOS transistor. By making the potentials C1, C2, C3 and C4 at the gates of the respective pass transistors 6 to 9 a power supply potential (corresponding to the logic value "1") or a ground potential (corresponding to the logic value "0"), it is possible to control the conduction/non-conduction of the respective pass transistors 6 to 9.

The following Table 1 shows combinations of the control signals C1, C2, C3 and C4 applied to the gates of the pass transistors 6 to 9, and the characteristics of the delay circuit 10 which are provided by these respective combinations.

TABLE 1

| C1 | C2 | C3 | C4 | Delay mode |
|----|----|----|----|-----------|
| 0 | 1 | 1 | 0 | Standard inverter |
| 0 | 0 | 1 | 1 | Sensitive to nMOS transistor |
| 1 | 1 | 0 | 0 | Sensitive to pMOS transistor |
| 1 | 0 | 0 | 1 | Sensitive to nMOS transistor and pMOS transistor |

Figure 4A:
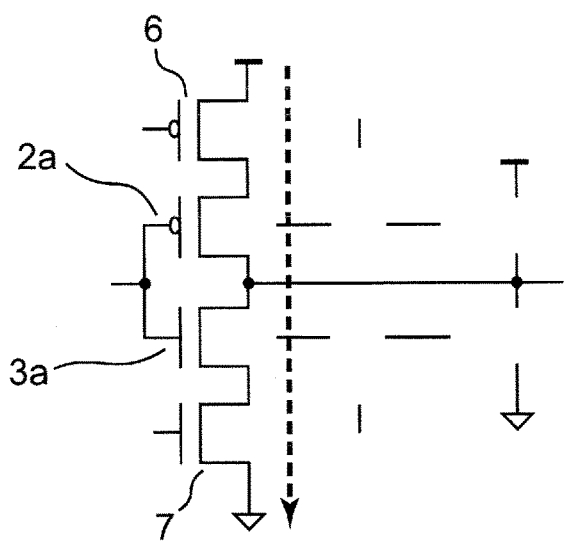
FIGS. 4A, 4B and 4C are views showing equivalent circuits of the delay circuit according to the first embodiment.
Figure 4B:
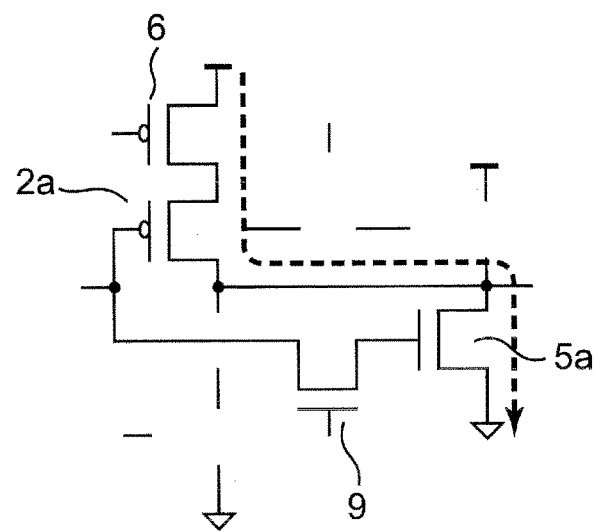
Figure 4C:
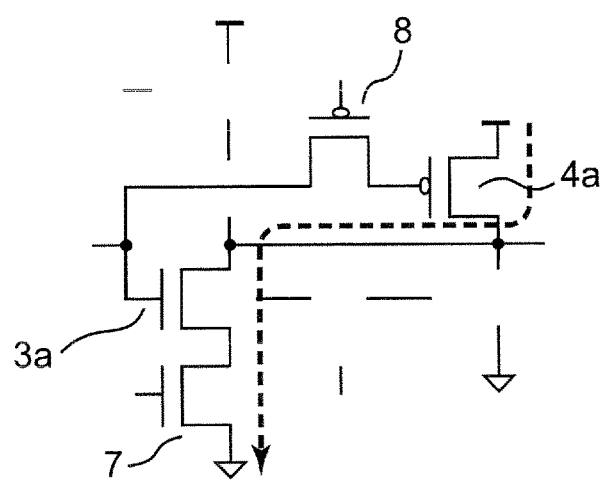

FIGS. 4A-4C shows equivalent circuits of the delay circuit 10a as shown in FIG. 3, each circuit having a configuration changed depending on the combination of the signal values C1, C2, C3 and C4 applied to the gates of the respective pass transistors 6 to 9.

Figure 18A:
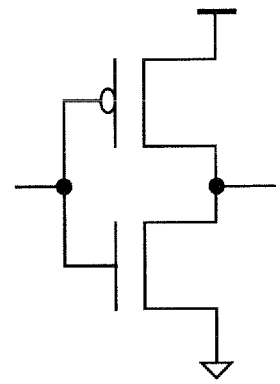
FIGS. 18A-18C are views showing examples of conventional delay circuits, in which nMOS transistors and pMOS transistors influence delay characteristics.

FIG. 4A shows an equivalent circuit of the delay circuit 10a in the case where the combination of the logic values of the control signals C1, C2, C3 and C4 is (0, 1, 1, 0). No input is applied to the second inversion logic gate, while the transistor 2a (the pull-up circuit) and the transistor 3a (the pull-down circuit) in the first inversion logic gate are active. This circuit configuration exhibits a delay characteristic similar to that of the circuit as shown in FIG. 18A and forms the configuration of a standard inverter circuit.

Figure 18B:
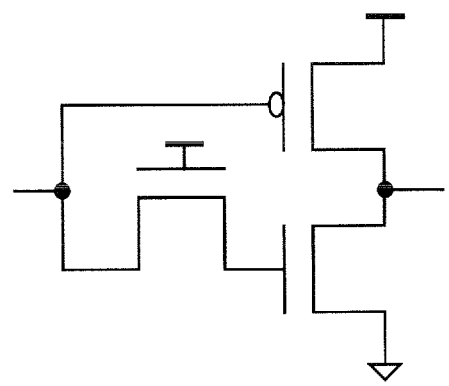

FIG. 4B show q of the delay circuit 10a in the case where the combination of the logic values of the control signals C1, C2, C3 and C4 is (0, 0, 1, 1). The transistor 2a (the pull-up circuit) in the first inversion logic gate, and the transistor 5a (the pull-down circuit) in the second inversion logic gate, which is through the nMOS pass transistor 9, are active. This circuit configuration exhibits a delay characteristic similar to that of the circuit as shown in FIG. 18B and forms a circuit configuration which is sensitive to the threshold value fluctuations in the nMOS transistors (which will be also referred to as "sensitive to the nMOS transistors, hereinafter).

Figure 18C:
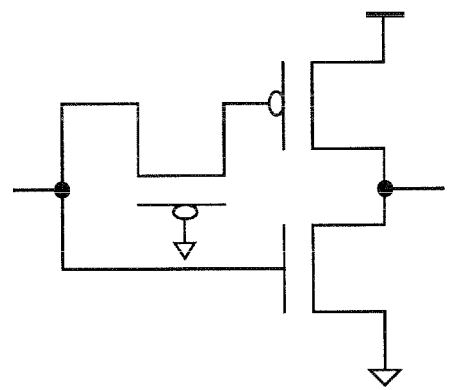
Figure 19:
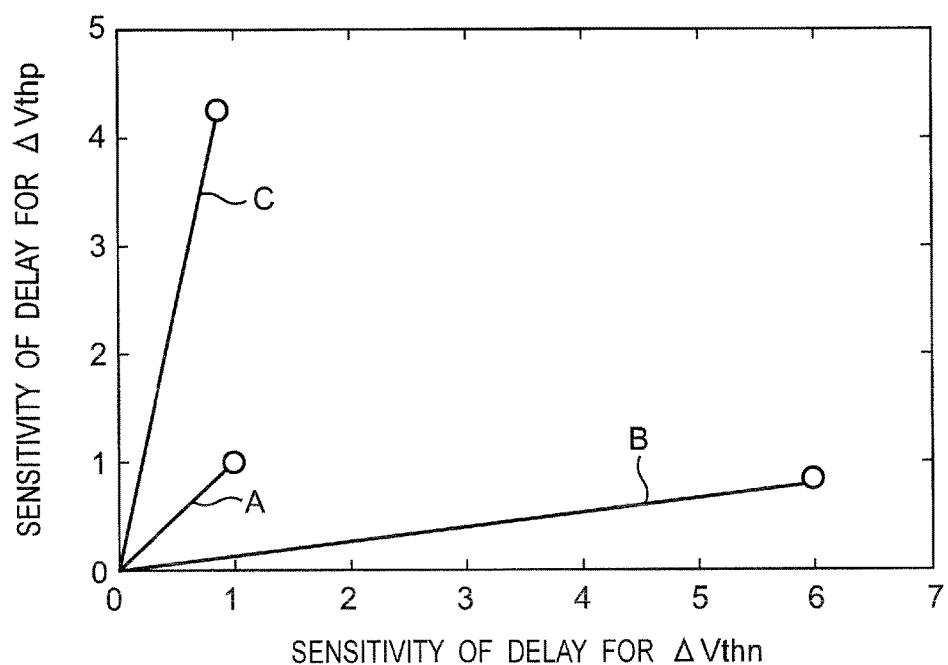
FIG. 19 is a view showing influence of amount of fluctuation $\Delta V_{thn}$ of the threshold voltage of the nMOS transistor and the amount of fluctuation ΔVthp of the threshold voltage of the pMOS transistor on a delay time, in the delay circuits as shown in FIGS. 18a-18C.

FIG. 4C shows an equivalent circuit of the delay circuit 10a in the case where the combination of the logic values of the control signals C1, C2, C3 and C4 is (1, 1, 0, 0). The transistor 3a (the pull-down circuit) in the first inversion logic gate, and the transistor 4a (the pull-up circuit) in the second inversion logic gate, which is through the pMOS pass transistor 8, are active. This circuit configuration exhibits a delay characteristic similar to that of the circuit as shown in FIG. 18C and forms a circuit configuration sensitive to the threshold value fluctuation in the pMOS transistors (which will be also referred to as "sensitive to the pMOS transistors, hereinafter).

As described above, according to the delay circuit 10, it is possible to realize plural delay characteristics, by changing the combination of the logic values of the control signals supplied to the pass transistors 6 to 9.

2. Evaluation of Variations

Hereinafter, there will be described evaluations of variations using the delay monitor circuit 100 having the aforementioned configuration.

2.1 Inter-Chip Variations

For evaluations of inter-chip variations, the delay circuits 10 in all the stages are controlled to have the same configuration, in the delay monitor circuit 100. In this case, it is necessary to determine the number of stages in the delay monitor circuit 100 in consideration of amounts of on-chip variations.

In evaluating variation in the nMOS transistors, the delay circuits 10 in all the stages are set to have a configuration sensitive to the nMOS transistor as shown in FIG. 4B, and the oscillation frequency of the delay monitor circuit 100 is measured. Namely, the pass transistor 8 is controlled to be turned off, and the pass transistor 9 is controlled to be turned on, so that the delay circuits 10 in all the stages have the same configuration.

Similarly, in evaluating variation in the pMOS transistors, the delay circuits 10 in all the stages are set to have a configuration sensitive to the pMOS transistors as shown in FIG. 4C.

Further, in evaluating the characteristics of circuits constituted by standard inverters, the delay circuits 10 in all the stages are configured to form a standard inverter, as shown in FIG. 4A.

As described above, different delay characteristics of three types can be evaluated, and the amounts of fluctuations of process parameters can be estimated from measured values using a method in Non-Patent Document 1. For example, in cases of assuming that factors of variations are only the threshold voltages of the nMOS transistors and the pMOS transistor. The first-order approximations in Formulas (1) and (2) are obtained.

$$\Delta f_n = k_{n,n} \Delta V_{thn} + k_{n,p} \Delta V_{thp} \quad (1)$$

$$\Delta f_p = k_{p,n} \Delta V_{thn} + k_{p,p} \Delta V_{thp} \quad (2)$$

In the above, $\Delta f_n$ and $\Delta f_p$ are each a difference between a measured value and a predicted value of the frequency of the configuration sensitive to the nMOS transistor or the configuration sensitive to the pMOS transistor. $k_{n,n}$ and $k_{n,p}$ are sensitivities of frequency of the configuration sensitive to the nMOS transistor with respect to the nMOS transistor and the pMOS transistor, respectively. $k_{p,n}$ and $k_{p,p}$ are sensitivities of the frequency of the configuration sensitive to the pMOS transistor. $\Delta V_{thn}$ and $\Delta_{thp}$ are amounts of fluctuations of the respective threshold voltages of the nMOS transistor and the pMOS transistor. The sensitivities can be determined through simulations, and the amounts $\Delta V_{thn}$ and $\Delta_{thp}$ of fluctuations of the threshold voltages can be estimated from the amounts of fluctuations of the measured frequencies.

2.2 On-Chip Variation

In order to evaluate on-chip variation, conventionally, multiple circuits of the same type are mounted on a chip and variations are statistically evaluated from characteristics of respective instances. With the delay monitor circuit 100 according to the present embodiment, the delay circuit in a specific stage is made to have a different delay characteristic from those of the other stages to enable measurement of the delay in this stage. As described above, a specific stage is made to have a different configuration from those of the other stages, which enables evaluations of on-chip variations with a single circuit.

At first, all the stages except a specific stage (a target stage) is set to have the same delay as that of the standard inverter (the configuration as shown in FIG. 4A), while the specific stage is set to have a greater delay value. For attaining this, all the stages except the specific stage (the target stage) is set to have the configuration of the standard inverter (FIG. 4A), while the specific stage is set to have the configuration as shown in FIG. 4B or FIG. 4C. Further, while the specific stage is sequentially shifted (scanned), the oscillation frequency of the output signal from the delay monitor circuit 100 is measured, thus enabling evaluation of a variation in the nMOS transistors or the pMOS transistors. By setting the delay circuit 10 in the target stage to be sensitive to the nMOS transistor or the pMOS transistor, it is possible to independently evaluate the variations of the nMOS transistors and the pMOFETs.

Next, as an example, estimation of the variation of the nMOS transistors will be described. In this case, the inverter in a specific stage is formed to have a circuit configuration as shown in FIG. 4B, while the inverters in the other stages are formed to have the circuit configuration of a standard inverter as shown in FIG. 4A. In this case, the measured frequency $f_{n,1}$ can be expressed as the following formula, using the sensitivity coefficients of the respective threshold voltages of the pass transistors 9 and the nMOS transistor 5a of which gate is connected to the pass transistors 9, and the like.

$$f_{n,1} = f_{n,10} + k_{n,1} \Delta V_{thn,1} + k_{n,2} \Delta_{thn,2} + \alpha \quad (3)$$

In this case, $f_{n,10}$ is a predicted value obtained from simulations in cases where there is no variation, and α is the total sum of the amounts of fluctuations in all the stages except the specific stage. In cases where there are a sufficiently larger number of stages, the random variations in the respective stages can be averaged, so that α can be assumed to be constant. $k_{n,1}$ and $k_{n,2}$ are sensitivities of the frequency to fluctuations of threshold voltages of the nMOS transistors 9 and 5a, respectively. $\Delta V_{thn,1}$ and $\Delta V_{thn,2}$ indicate amounts of variations of the respective threshold values of the nMOS transistors 9 and 5a.

Formula (3) can be obtained for each of the inverter stages, and, accordingly, the measured values for N stages can be obtained. Further, by statistically processing them in assuming that $k_{n,1}$ equals to $k_{n,2}$ and, also, $\Delta V_{thn,1}$ and $\Delta V_{thn,2}$ have the same dispersion, it is possible to obtain the variation σ of the threshold values $V_{thn}$ of the nMOS transistors.

$$\sigma \Delta_{fn} = k_n \sigma_{Vthn} \tag{4}$$

The variation of the threshold voltage of the pMOS transistor is estimated, similarly.

3. Conclusion

As described above, the delay circuit 10 according to the present embodiment is a reconfigurable delay circuit and includes an input node for inputting an input signal, an output node for outputting an output signal, a first inversion circuit, and a second inversion circuit. The first inversion circuit includes the serial circuit containing the pull-up circuit 2 adapted to connect the power supply potential to the output node when being turned on based on the input signal, and the pull-down circuit 3 adapted to connect the ground potential to the output node when being turned on based on the input signal. The second inversion circuit includes the serial circuit containing the pull-up circuit 4 adapted to connect the power supply potential to the output node when being turned on based on the input signal, and the pull-down circuit 5 adapted to connect the ground potential to the output node when being turned on based on the input signal. Further, the delay circuit 10 includes the pass transistor 6 connected in series between the power supply potential and the pull-up circuit 2 in the first inversion circuit, and the pass transistor 7 connected in series between the ground potential and the pull-down circuit 3 in the first inversion circuit. Further, the delay circuit 10 includes the pass transistor 8 connected in series between the input node and the input of the pull-up circuit 4 in the second inversion circuit, and the pass transistor 9 connected in series between the input node and the input of the pull-down circuit 5 in the second inversion circuit. The combination of the control signals C1 to C4 applied to the gates of the pass transistors 6 to 9 changes the delay characteristics of the delay circuit 10.

Further, the delay monitor circuit 100 according to the present embodiment is a circuit for measuring delay of signal transmission time in an integrated circuit and includes a circuit composed of reconfigurable delay circuits having the aforementioned configuration which are connected in series to each other in plural stages.

Since the delay circuit 10 has the aforementioned configuration, the delay circuit 10 can be set to have various configurations, such as a configuration sensitive to the pMOS transistor, a configuration sensitive to the nMOS transistor, and the like. Therefore, by properly configuring the delay circuit 10 according to aim of measurement, it is possible to implement measurements of plural types, with a single delay monitor circuit. This eliminates the necessity of placing delay monitor circuits for respective types of measurements, thus resulting in suppression of increase of the chip area.

Second Embodiment

In the present embodiment, another configuration of the delay circuit 10 is described.

Figure 5:
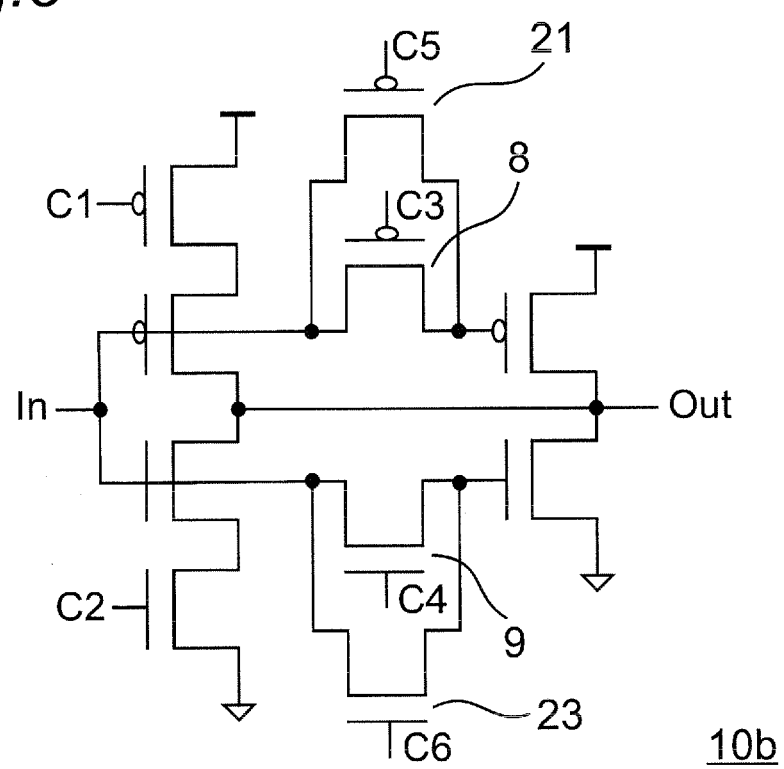
FIG. 5 is a view showing the configuration of a delay circuit according to a second embodiment of the present invention.

FIG. 5 shows the configuration of a delay circuit according to the present embodiment. The delay circuit 10b according to the present embodiment includes a pMOS pass transistor 21 and an nMOS pass transistor 23 which are connected in parallel to the pMOS pass transistor 8 and the nMOS pass transistor 9, respectively, in the configuration of the delay circuit 10a according to the first embodiment as shown in FIG. 2 or FIG. 3. Namely, as pass transistors connected in series to the input of the second inversion logic gate, the two pass transistors are connected thereto in parallel. In this embodiment, although an example where the two pass transistors are connected in parallel is described, three or more pass transistors may be connected in parallel.

Figure 6:
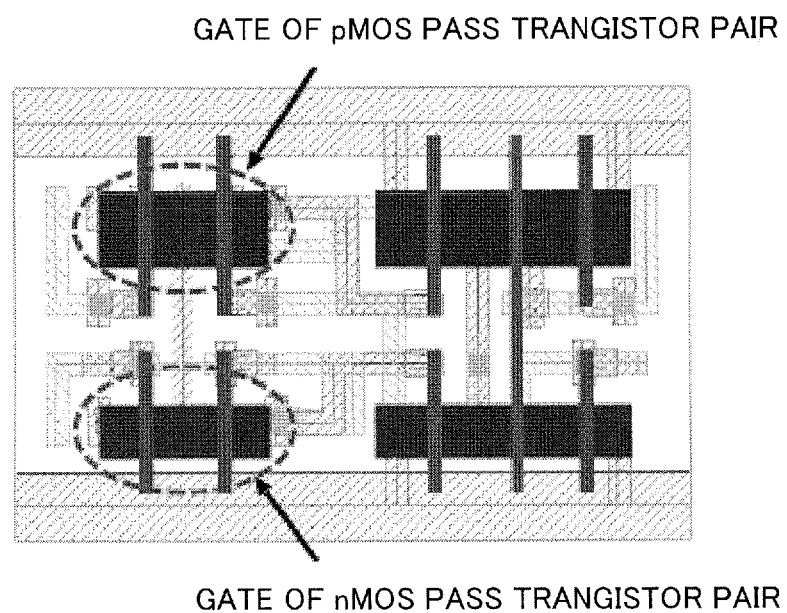
FIG. 6 is a view of a layout of a delay circuit according to a second embodiment.

FIG. 6 shows an example of the layout of the delay circuit 10b according to the present embodiment. In order to decrease the characteristic variations depending on the layout, the two gates of the pair of the nMOS transistors 9 and 23 (the pMOS pass transistors 8 and 21) are made to share the same source diffusion region.

The following Table 2 shows combinations of control signals C1, C2, C3, C4, C5 and C6 applied to the gates of the pass transistors 6 to 9 and 21 and 23, and the characteristics of the delay circuit 10b which are provided by these respective combinations.

TABLE 2

| C1 | C2 | C3 | C4 | C5 | C6 | Delay mode |
|---|---|---|---|---|---|---|
| 0 | 1 | 1 | 0 | 1 | 0 | Standard inverter |
| 0 | 0 | 1 | 0 | 1 | 1 | Sensitive to the nMOS transistor |
| 0 | 0 | 1 | 1 | 1 | 0 | Sensitive to the nMOS transistor |
| 1 | 1 | 0 | 0 | 1 | 0 | Sensitive to the pMOS transistor |
| 1 | 1 | 1 | 0 | 0 | 0 | Sensitive to the pMOS transistor |

According to the configuration of the delay circuit 10b as described above, it is possible to evaluate on-chip variations for each pass transistor.

For example, in the cases where the combination of the logic values of the control signals C1, C2, C3, C4, C5 and C6 is (0,0,1,1,1,0) and (0,0,1,0,1,1), a delay characteristic similar to that of FIG. 4B can be obtained. The difference between both the combinations is the nMOS transistor which applies a signal to the gate of the pull-down nMOS transistor 5a in the second inversion logic gate. Therefore, by determining the difference in delay time between both the cases, it is possible to evaluate the on-chip variation in the corresponding two nMOS transistors 9 and 23. Similarly, by determining the difference in delay time between the case where the combination of the logic values of the signals C1, C2, C3, C4, C5 and C6 is (1, 1, 0, 0, 1, 0) and the case where it is (1, 1, 1, 0, 0, 0), it is possible to evaluate the on-chip variation in the pMOS pass transistors 8 and 21.

Evaluations of on-chip variations using the delay monitor circuit 100 including the delay circuits 10b according to the present embodiment in respective stages is described below.

At first, delays of all the stages except a specific stage (a target stage) are set to the same value as that of the standard inverter, while delay of the specific stage is set to a larger delay. Hereinafter, as an example, there will be described a configuration for evaluating the on-chip variation of the nMOS transistor.

In the target stage, in the first measurement, the nMOS pass transistor 9 is turned on (the nMOS pass transistor 23 is turned off), and, in the second measurement, the nMOS pass transistor 23 is turned on (the nMOS pass transistor 9 is turned off). Based on the difference between the two measured values, the difference in characteristic between the pass transistor 9 and the pass transistor 23 is evaluated. Further, while the target stage is scanned, the oscillation frequency is measured to evaluate the variation of the nMOS transistor. By setting the target stage to be sensitive to the nMOS transistor or the pMOS transistor, it is possible to evaluate the variation of the nMOS transistor or the pMOS transistor, independently.

Next, the estimation of the variation of the nMOS transistor is described in detail below. Referring to FIG. 5, the frequency $f_{n,1}$ with only the nMOS pass transistor 9 turned on, and the frequency $f_{n,2}$ with only the nMOS pass transistor 23 turned on can be expressed as the following first-order approximation formulas using the sensitivity coefficients of the respective pass transistors.

$$f_{n,1} = f_{n,10} + k_{n,1} \Delta V_{thn,1} + \alpha \quad (5)$$

$$f_{n,2} = f_{n,20} + k_{n,2} \Delta V_{thn,2} + \alpha \quad (6)$$

In the above, $f_{n,10}$ and $f_{n,20}$ are predicted values obtained from simulations in cases where there is no variation, and $\alpha$ is the total sum of amounts of fluctuations in all the inverter stages except the stage having the inhomogeneous inverter. In cases where there are a sufficiently larger number of stages, the random variations in the respective stages can be averaged, and $\alpha$ can be assumed to be constant. The coefficients $k_{n,1}$ and $k_{n,2}$ are sensitivities of frequency to the fluctuations of the threshold voltage of the respective pass transistors. $\Delta V_{thn,1}$ and $\Delta V_{thn,2}$ represent amount of variation of the threshold value of the pass transistor. In consideration of $k_{n,1} = k_{n,2} = k_n$, the following relationship can be obtained between the frequency difference and the threshold voltage difference between the pass transistors, based on the difference between the formulas (5) and (6).

$$\Delta f_n = k_n \Delta V_{thn} \quad (7)$$

Formula (7) can be obtained for each stage, and measured values for N stages can be obtained. Accordingly, the variation $\sigma$ of $\Delta f_n$ can be obtained, and the variation $\sigma \Delta V_{thn}$ of the threshold voltage can be estimated as follows, using the variation.

$$\sigma \Delta f_n = k_n \sigma \Delta V_{thn} \quad (8)$$

$$\sigma \Delta V_{thn} = \sigma \Delta V_{thn}/(\sqrt{2}) \quad (9)$$

The threshold voltage variation in the pMOS transistor can be also estimated, in the same way as that of the case of the nMOS transistor.

With the configuration of the delay circuit 10b according to the present embodiment, it is possible to accurately measure variations in respective transistors in a chip.

Third Embodiment

In the present embodiment, yet another configuration of the delay circuit will be described.

In the first embodiment, when the signals C1, C2, C3 and C4 are applied, either one of the pass transistors 8 and 9 connected to the gates of the pMOS transistor 4a and the nMOS transistor 5a in the second inversion logic gate is controlled to be turned off. Therefore, the potential at the gate of the transistor 4a or 5a connected to the pass transistor 8 or 9 which is controlled to be turned off becomes a floating potential. The transistor 4a or 5a having such a floating potential at its gate does not contribute to the inverter function of the delay circuit 10a and is ideally in a non-conduction state. However, in actual, a leak current may flow through the transistor 4a or 5b, due to the floating potential at its gate. This leak current may influence the delay characteristic of the delay circuit 10a, thereby inducing degradation of the measurement accuracy. Therefore, in the present embodiment, the configuration of a delay circuit for overcoming the problem of such a leak current is described. FIG. 7 shows an example of the configuration of the delay circuit according to the present embodiment.

Figure 7A:
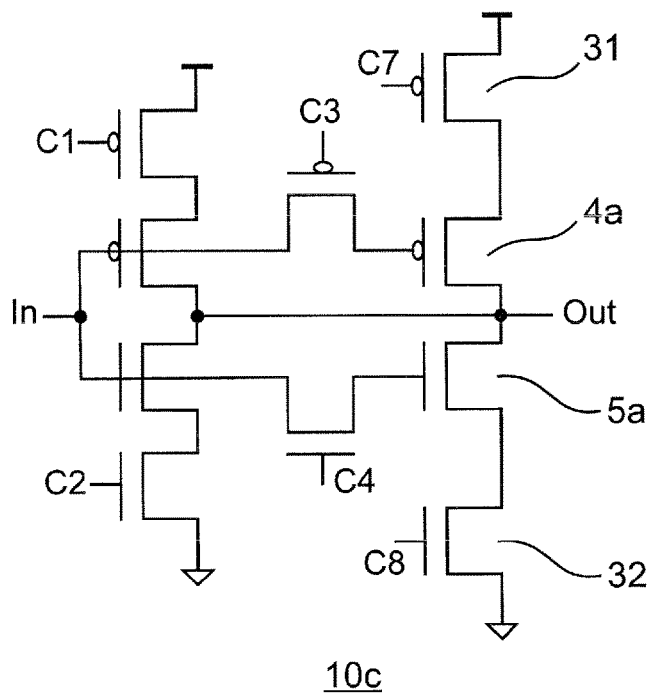
FIGS. 7A and 7B are views showing the configuration of a delay circuit according to a third embodiment of the present invention.

In the delay circuit 10c as shown in FIG. 7A, a pMOS pass transistor 31 is inserted between the power supply and the pMOS transistor 4a in the second inversion logic gate in the delay circuit as shown in FIG. 3. Further, an nMOS pass transistor 32 is inserted between the ground (the ground potential) and the nMOS transistor 5a in the second inversion logic gate.

In this configuration, the pass transistor 31 or 32 which is connected to the transistor 4a or 5a of which gate potential is a floating potential is turned off, in the second inversion logic gate. This cuts off the path between the power supply and the pMOS transistor 4a or the path between the nMOS transistor 5a and the ground, preventing a leak current in the pMOS transistor 4a or the nMOS transistor 5a. For example, when the nMOS transistor 5a has a floating potential at its gate (in the cases of FIGS. 4A and 4C), the nMOS pass transistor 32 is turned off. This cuts off the path between the nMOS transistor 5a and the ground, preventing a leak current flowing from the nMOS transistor 5a to the ground. Further, when the gate potential of the pMOS transistor 4a is a floating potential (in the cases of FIGS. 4A and 4B), the pMOS pass transistor 31 is turned off. This cuts off the path between the pMOS transistor 4a and the power supply, preventing a leak current flowing from the power supply to the pMOS transistor 4a. The positions of the pMOS transistor 4a in the second inversion logic gate and the pMOS pass transistor 31 can be interchanged. Further, the positions of the nMOS transistor 5a and the nMOS pass transistor 32 can be interchanged.

Figure 7B:
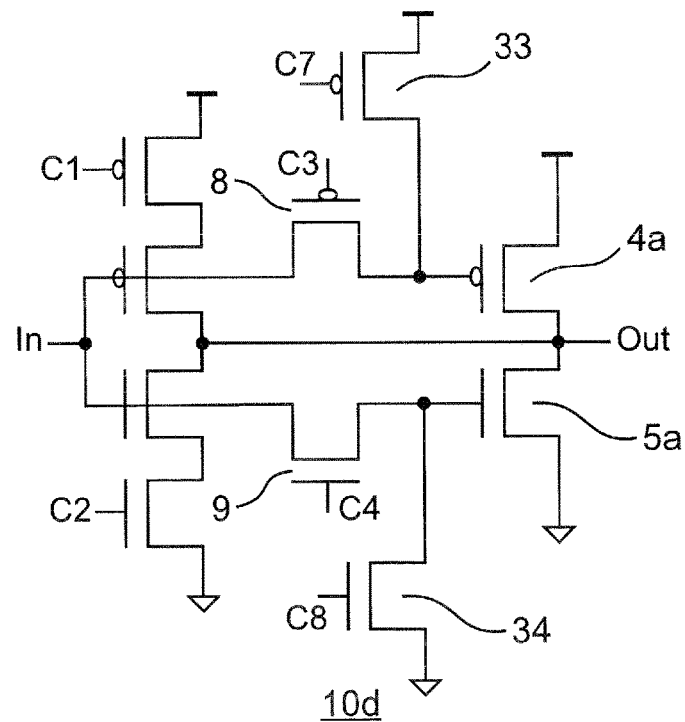

FIG. 7B is a view showing another example of the configuration of the delay circuit according to the present embodiment. In the delay circuit 10d as shown in FIG. 7B, a pMOS pull-up transistor 33 is inserted between the power supply and the gate of the pMOS transistor 4a in the second inversion logic gate, in the delay circuit as shown in FIG. 3. Further, an nMOS pull-down transistor 34 is inserted between the ground and the gate of the nMOS transistor 5a in the second inversion logic gate.

In this configuration, the transistor 33 or 34 which is connected to the transistor 4a or 5a in the second inversion logic gate which may have a floating potential at its gate is turned on. This can control the potential at the gate of the transistor 4a or 5a to be the power supply potential or the ground potential, so that the transistor 4a or 5a can be completely turned off, thereby preventing a leak current therethrough.

For example, when the potential of the gate of the nMOS transistor 5a may be a floating potential (in the cases of FIGS. 4A and 4C), the nMOS pass transistor 34 is turned on. This completely turns off the nMOS transistor 5a, preventing a leak current at the nMOS transistor 5a. Further, when the potential of the gate of the pMOS transistor 4a may be a floating potential (in the cases of FIGS. 4A and 4B), the pMOS pass transistor 33 is turned on. This completely turns off the pMOS transistor 4a, thus preventing a leak current at the pMOS transistor 4a.

The configuration for preventing the leak current as shown in FIG. 7 can be applied to the configuration of the delay circuit according to the second embodiment.

Fourth Embodiment

A device is described below, which is a device for measuring variations in characteristics of circuit elements in an integrated circuit (semiconductor chip), using the delay monitor circuit composed of the delay circuits according to the aforementioned embodiments.

Figure 8:
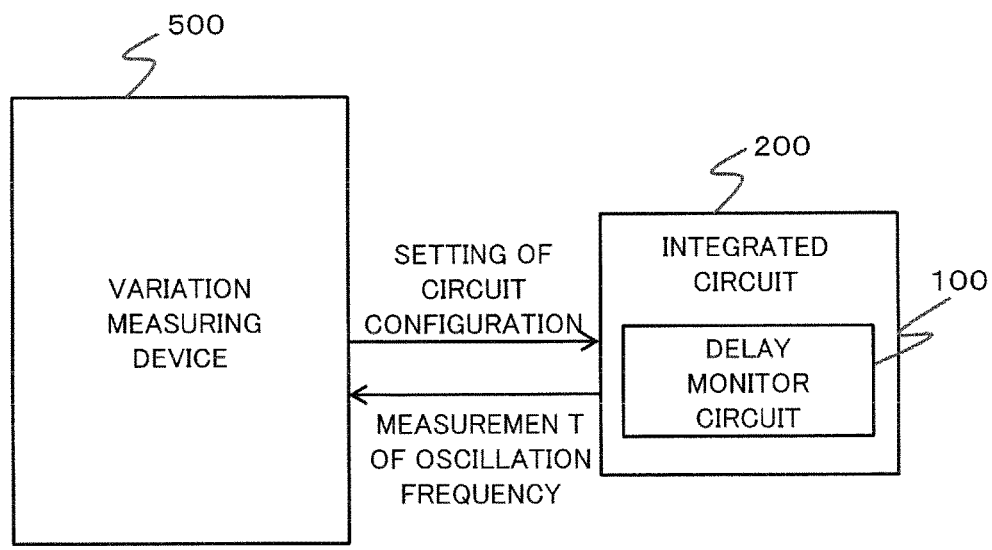
FIG. 8 is a view showing a device for measuring variations for a delay monitor circuit in each embodiment of the present invention.

FIG. 8 shows the configuration of the device for measuring variations in characteristics of circuit elements in an integrated circuit. A variation measuring device 500 is a device for determining characteristics of circuit elements (transistors) included in an integrated circuit 200. The integrated circuit 200 includes the delay monitor circuit 100 including the reconfigurable delay circuits as shown in any of the aforementioned embodiments.

The variation measuring device 500 transmits a control signal for setting the configuration (namely, the delay characteristic) of each of the delay circuits in the delay monitor circuit 100, to the integrated circuit 200, through a signal terminal of the integrated circuit 200. This control signal is a signal for setting the circuit configuration of each delay circuit to any of the configurations as shown in FIGS. 4A-4C, for example, in the delay monitor circuit 100, namely a signal for setting the logic values of the control signals C1, C2, C3 and C4 for each stage. The control signal is an input of the shift resister 53 as shown in FIG. 1. Thereafter, the variation measuring device 500 measures the oscillation frequency of the delay monitor 100 with the counter 57 to measure variations in transistors based on the result of the measurement of the oscillation frequency. The variation measuring device 500 includes a control device (for example, a CPU) for executing operations as described below. The control device statistically processes the result of the measurement of the oscillation frequency according to the procedures described in the aforementioned embodiments, to measure variation of the threshold value of pMOS transistor and nMOS transistor.

For example, in cases of evaluating the variation in a transistor on the semiconductor chip, the variation measuring device 500 operates according to the following procedures:

(First Step) The variation measuring device 500 sets the control signals C1 to C4 for each stage in such a way as to make the configuration of the delay circuit in a specific stage different from the configurations of the delay circuits in the other stages than the specific stage and, further, applies these control signals to the respective pass transistors 6, 7, . . . , in the delay monitor circuit 100;

(Second Step) The variation measuring device 500 measures the oscillation frequency of the delay monitor circuit 100;

(Third Step) The first step and the second step are repeated, while the specific stage is sequentially shifted (scanned); and (Fourth Step) Based on the result of the measurement obtained in the third step, the variation measuring device 500 determines the variation of the characteristics of the circuit elements in the chip on which the integrated circuit 200 is formed.

With the aforementioned processing, it is possible to evaluate the variation in the transistor in the chip.

Further, for evaluating the variation in transistors among chips, the variation measuring device 500 operates according to the following procedures.

(First Step) The variation measuring device 500 sets the control signals for each stage in such a way as to make the delay circuits in all the stages have the same configuration and applies these control signals to the respective pass transistors 6, 7, . . . .

(Second Step) The variation measuring device 500 measures the oscillation frequency of the delay monitor circuit 100 in the state where these control signals are applied thereto.

(Third Step) Based on the result of the measurement obtained in the second step, the variation measuring device 500 measures the variation in the characteristics of the circuit elements among the chips on which the integrated circuit 200 is formed.

Through the aforementioned processing, it is possible to evaluate the variation in the transistors among the chips.

Further, in the case where the integrated circuit 200 includes the delay monitor circuit 10b including the pass transistors 8 and 21, 9 and 23 which are connected in parallel with each other to the input of the second inversion logic gate, as shown in the second embodiment (FIG. 5), the variation measuring device 500 may operate according to the following procedures.

a) In a Case of Measurement of Variation in pMOS Transistor (First Step) The variation measuring device 500 sets the control signals C1 to C4 for each stage in such a way as to make the configuration of the delay circuit in a specific stage different from the configurations of the delay circuits in the other stages than the specific stage and, further, applies these control signals to the respective pass transistors 6 to 9, 21 and 23.

(Second Step) The variation measuring device 500 measures the oscillation frequency of the delay monitor circuit 100 in the state where these control signals are applied thereto.

(Third Step) The first step and the second step are repeated, while the specific stage is sequentially shifted.

(Fourth Step) Based on the result of the measurement obtained in the third step, the variation measuring device 500 measures the variation in the characteristics of the circuit elements in the chip on which the integrated circuit is formed.

In this case, the second step includes the following steps.

(Fifth Step) For the specific stage, the variation measuring device 500 turns on the pMOS pass transistor 8 and turns off the pMOS pass transistor 21 and measures the oscillation frequency of the delay monitor circuit 100.

(Sixth Step) For the specific stage, the variation measuring device 500 turns off the pMOS pass transistor 8 and turns on the pMOS pass transistor 21 and measures the oscillation frequency of the delay monitor circuit 100.

(Seventh Step) The variation measuring device 500 calculates the difference between the result of the measurement in the fifth step and the result of the measurement in the sixth step.

With the aforementioned processing, it is possible to evaluate the variation in the transistors in the chip for each transistor.

b) In a Case of Measurement of Variation in nMOS Transistor (First Step) The variation measuring device 500 sets the control signals C1 to C4 for each stage in such a way as to make the configuration of the delay circuit in a specific stage different from the configurations of the delay circuits in the other stages than the specific stage and, further, applies these control signals to the respective pass transistors 6 to 9, 21 and 23.

(Second Step) The variation measuring device 500 measures the output of the delay monitor circuit 100, in the state where these control signals are applied thereto.

(Third Step) The first step and the second step are repeated, while the specific stage is sequentially shifted.

(Fourth Step) Based on the result of the measurement obtained in the third step, the variation measuring device 500 measures the variation in the characteristics of the circuit elements in the chip on which the integrated circuit is formed.

In this case, the second step includes the following steps.

(Fifth Step) For the specific stage, the variation measuring device 500 turns on the nMOS pass transistor 9 and turns off the nMOS pass transistor 23 and measures the oscillation frequency of the delay monitor circuit 100.

(Sixth Step) For the specific stage, the variation measuring device 500 turns off the nMOS pass transistor 9 and turns on the nMOS pass transistor 23 and measures the oscillation frequency of the delay monitor circuit 100.

(Seventh Step) The variation measuring device 500 calculates the difference between the result of the measurement in the fifth step and the result of the measurement in the sixth step.

With the aforementioned variation measuring method, it is possible to evaluate the variation in the transistors in the chip, for each transistor.

Fifth Embodiment

Figure 9:
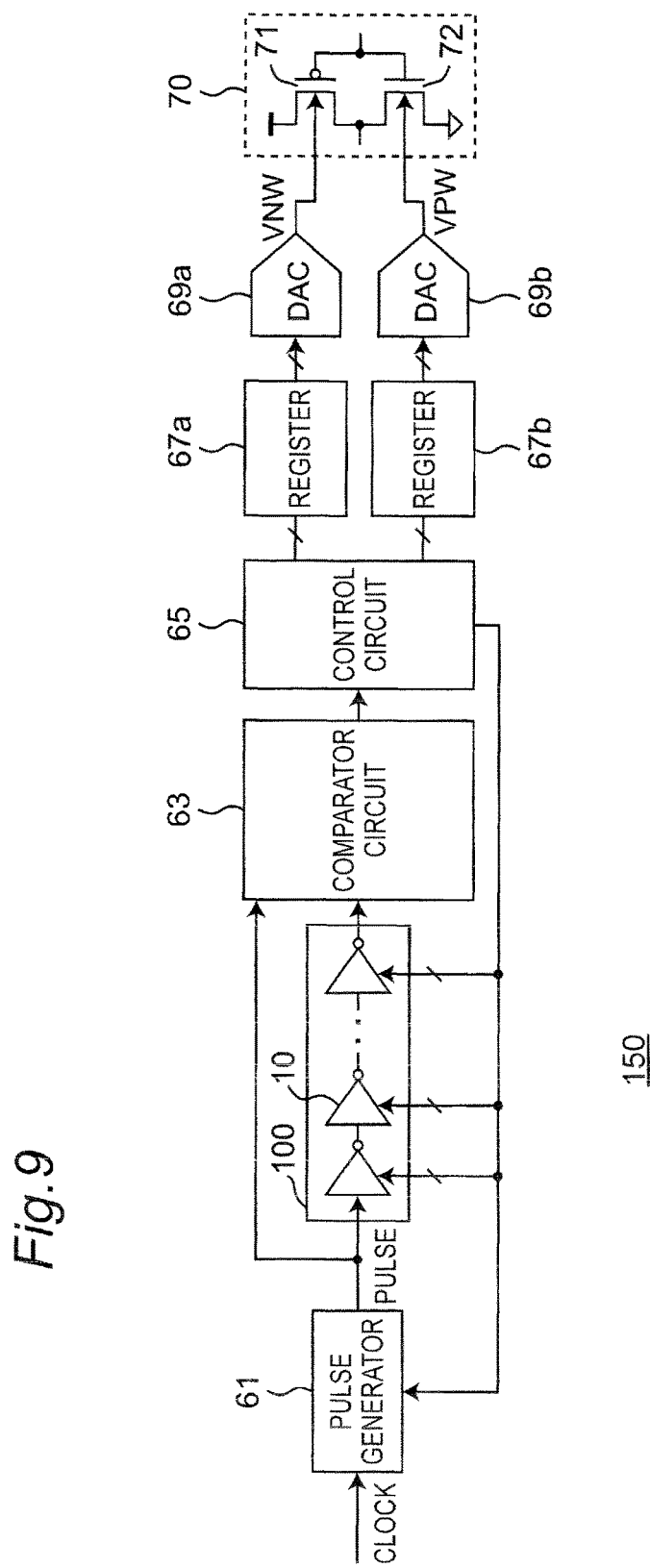
FIG. 9 is a view showing a circuit configuration for automatically compensating variations, using results of measuring variations in characteristics of transistors in chip (fifth embodiment).

The present embodiment describes below a circuit for automatically compensating variations, using results of measurement of variations in transistor characteristics in semiconductor chips (integrated circuits). FIG. 9 shows the configuration of a variation compensation circuit for automatically compensating variations in transistor characteristics.

1. Configuration of Variation Compensation Circuit

The variation compensation circuit 150 as shown in FIG. 9 includes a pulse generator 61, a delay monitor circuit 100, a comparator circuit 63, a control circuit 65, registers 67a and 67b, and DA converters 69a and 69b. The variation compensation circuit 150 is formed in an integrated circuit and compensates variations in characteristics of a pMOS transistor 71 and an nMOS transistor 72 included in the integrated circuit.

The pulse generator 61 generates pulses to be applied to the delay monitor circuit 100. The delay monitor circuit 100 and delay circuits 10 have the same configurations and functions as those described in the first embodiment. A pulse width of a pulse signal outputted from the pulse generator 61 is set to be a width corresponding to a reference value of the delay time of the delay monitor circuit 100. The delay time of the delay monitor circuit 100 is varied according to the configurations (types) of the delay circuits 10 composing the delay circuit 100.

The comparator circuit 63 compares the output from the pulse generator 61 with the output from the delay monitor circuit 100 and, further, outputs a signal indicative of the result of the comparison. More specifically, as shown in FIGS. 10A-10B, the comparator circuit 63 compares falling timing of the output signal (the pulse signal) from the pulse generator 61 (timing defining the delay reference value) with rising timing of the output signal from the delay monitor circuit 100 and outputs a signal indicative of the result of the comparison. The comparator circuit 63 can be realized by a phase frequency detection circuit (phase frequency detector) as shown in FIG. 11, for example. The circuit as shown in FIG. 11 outputs an output signal of (UP, DOWN)=(H, L) when the falling of the output signal from the pulse generator 61 is earlier than the rising of the output signal from the delay monitor circuit 100. This circuit outputs an output signal of (UP, DOWN)=(L, H) when the falling of the output signal from the pulse generator 61 is slower than the rising of the output signal from the delay monitor circuit 100. When both the falling of the output signal from the pulse generator 61 and the rising of the output signal from the delay monitor circuit 100 occurs, a reset pulse is inputted to the flip-flops to reset the flip-flops.

The control circuit 65 controls the pulse generator 61 and the delay monitor circuit 100. More specifically, the control circuit 65 supplies the delay monitor circuit 100 with control signals for changing the configurations of the respective delay circuits 10 in the delay monitor circuit 100 to either one of the configurations as shown in FIGS. 4A to 4C. At the same time, the control circuit 65 outputs, to the pulse generator 61, a control signal for controlling the pulse width of the pulse outputted from the pulse generator 61 to be a width (the reference value of the delay time) in accordance with the configuration of the delay monitor circuit 100. Further, the control circuit 65 outputs control signals for controlling the transistor substrate voltages for the transistors forming the integrated circuit.

The registers 67a and 67b store the values (digital values) of the control signals for controlling the substrate voltages of transistors outputted from the control circuit 65. More specifically, the register 67a stores the value (the digital value) of the control signal for controlling the substrate voltage (n-well voltage) VNW for the pMOS transistor. The register 67b stores the value (the digital value) of the control signal for controlling the substrate voltage (p-well voltage) VPW for the nMOS transistor.

The DA (Digital to Analog) converters 69a and 69b output control signals (analog signals) for controlling the respective substrate voltages NNW and VPW) for the pMOS transistor 71 and the nMOS transistor 72, based on the values stored in the registers 67a and 67b. By controlling the substrate voltages, variations of the pMOS transistor 71 and the nMOS transistor 72 are compensated.

2. Variation Compensating Operation

Variation compensating operation by the variation compensation circuit 150 is described below. In the following description, as an example, an operation for automatically compensating inter-chip variations which is performed continuously during operations of the integrated circuit is described.

The control circuit 65 changes over the configurations of the delay circuits 10 in all the stages in the delay monitor circuit 100 to the configuration as shown in FIG. 4B (the configuration sensitive to the nMOS transistor) or the configuration as shown in FIG. 4C (the configuration sensitive to the pMOS transistor). At this time, the control circuit 65 controls the pulse width of the pulse outputted from the pulse generator 61 to a pulse width in accordance with the configuration of the delay circuit 10.

FIG. 12 is a view showing a pulse signal outputted from the pulse generator 61 in a case of automatically compensating the variation, while changing over the configurations of the delay circuits 10 to the configuration as shown in FIG. 4B or FIG. 4C. As shown in the figure, the control circuit 65 sets the configurations of the delay circuits 10 to the configuration as shown in FIG. 4B or FIG. 4C. At the same time, the control circuit 65 controls the pulse width of the pulse signal outputted from the pulse generator 61 to be a pulse width corresponding to the set configuration of the delay circuits 10. The control circuit 65 provides a predetermined interval (a time period corresponding to 1000 clocks, for example), from setting the configurations of the delay circuits 10 to the configuration as shown in FIG. 4B (or FIG. 4C), to next setting them to the configuration as shown in FIG. 4B (or FIG. 4C). The provision of this interval is because the transistor substrate voltages take a response time. Namely, as described later, the transistor substrate voltage is controlled, using the result of measurement of the transistor characteristics when the delay circuits are set to the configuration as shown in FIG. 4B or FIG. 4C. At this time, since the substrate voltages take a time to be stabilized, it is necessary to enter the next measurement cycle, after the changes of the substrate voltage is stabilized.

The pulse generator 61 creates a pulse signal from a clock signal under control of the control circuit 65. and outputs the pulse signal. The delay monitor circuit 100 inputs the pulse signal from the pulse generator 61, and outputs an output signal having a delay time corresponding to the configuration of the delay circuit 10. For example, when each delay circuit 10 is reconfigured to be the configuration as shown in FIG. 4B (the configuration sensitive to the nMOS transistor) by the control circuit 65, the output signal outputted from the delay monitor circuit 100 has a delay time reflecting the characteristic variation in the nMOS transistor. Accordingly, by determining the delay time of the output signal outputted from the delay monitor circuit 100, it is possible to determine the characteristics of the nMOS transistors.

The comparator circuit 63 inputs the output signal (the pulse signal) from the pulse generator 61 and the output signal from the delay monitor circuit 100, and compares the delay time in the delay monitor circuit 100 with the reference value of the delay time (the pulse width of the output signal from the pulse generator 61). More specifically, as shown in FIG. 10, the comparator circuit 63 compares the rising timing of the output signal from the delay monitor circuit 100 (the delay time) with the falling timing of the output signal (the pulse signal) from the pulse generator 61 (the reference value of the delay time). When the rising timing of the output signal from the delay monitor circuit 100 is slower than the falling timing of the output signal from the pulse generator 61, the comparator circuit 63 determines that the delay time in the delay monitor circuit 100 is larger than the reference value. On the other hand, when the rising timing of the output signal from the delay monitor circuit 100 is earlier than the falling timing of the output signal from the pulse generator 61, the comparator circuit 63 determines that the delay time in the delay monitor circuit 100 is smaller than the reference value.

When the delay time in the delay monitor circuit 100 is larger than the reference value (the pulse width of the output signal from the pulse generator 61), it is considered that the delay in the transistor is large. On the other hand, when the delay time in the delay monitor circuit 100 is smaller than the reference value, it is considered that the delay in the transistor is small. When the delay in the transistor is large, the transistor substrate voltage is changed in the forward bias direction, such that the delay time is equal to the reference value to compensate the transistor characteristics. On the other hand, when the delay in the transistor is small, the transistor substrate voltage is changed in the reverse bias direction, such that the delay time is equal to the reference value to compensate the transistor characteristics.

The control circuit 65 outputs control signals for controlling the voltages applied to the substrates, based on the output from the comparator circuit 63. The values of the control signals outputted from the control circuit 65 are held in the registers 67*a* and 67*b*.

For example, when each delay circuit 10 is reconfigured to be the configuration as shown in FIG. 4B (the configuration sensitive to the nMOS transistor), if the delay time in the delay monitor circuit 100 is determined to be larger than the reference value based on the output from the comparator circuit 63, the control circuit 65 controls the substrate voltage VPW for the nMOS transistor 72 in such a way as to decrease the delay caused by the characteristics of the nMOS transistor 72. In this case, the control circuit 65 outputs a control signal for changing the substrate voltage VPW for the nMOS transistor 72 in the forward bias direction. On the other hand, if the delay time in the delay monitor circuit 100 is determined to be smaller than the reference value, the control circuit 65 controls the substrate voltage VPW for the nMOS transistor 72 in such a way as to increase the delay caused by the characteristics of the nMOS transistor 72. In this case, the control circuit 65 outputs a control signal for changing the substrate voltage VPW for the nMOS transistor 72 in the reverse bias direction.

Similarly, when each delay circuit 10 is reconfigured to be the configuration as shown in FIG. 4C (the configuration sensitive to the pMOS transistor), if the delay time in the delay monitor circuit 100 is determined to be larger than the reference value based on the output from the comparator circuit 63, the control circuit 65 outputs a control signal for controlling the substrate voltage VNW for the pMOS transistor 71 in such a way as to decrease the delay caused by the pMOS transistor 71. On the other hand, if the delay time in the delay monitor circuit 100 is determined to be smaller than the reference value, the control circuit 65 outputs a control signal for controlling the substrate voltage VNW for the pMOS transistor 71 in such a way as to increase the delay caused by the pMOS transistor 71.

As described above, the control circuit 65 measures the characteristics of the pMOS transistor 71 and the nMOS transistor 72, while changing over the configurations of the respective delay circuits 10. According to the result of the measurement, the control circuit 65 outputs control signals for controlling the substrate voltages VNW and VPW for the pMOS transistor 71 and the nMOS transistor 72. The value of the control signal for controlling the substrate voltage VNW for the pMOS transistor 71, which is outputted from the control circuit 65, is stored in the register 67*a* for controlling the pMOS transistor. Further, the value of the control signal for controlling the substrate voltage VPW for the nMOS transistor 72 is stored in the register 67*b* for controlling the nMOS transistor.

The DA converters 69*a* and 69*b* generate respective Substrate voltages for the pMOS transistor 71 and the nMOS transistor 72, based on the values of the control signals stored in the registers 69*a* and 69*b*. Thus, the characteristics of the pMOS transistor 71 and the nMOS transistor 72 which form the integrated circuit are compensated to standard characteristics.

As described above, during operation of the integrated circuit, the substrate voltages required for compensating the transistor characteristics are continuously determined, further, the values of them are stored in the registers 67*a* and 67*b*, and variations therein are automatically compensated based on the stored value. In this case, since the values in the registers 67*a* and 67*b* are continuously updated, the operation speed of the circuit can be kept constant, even in the event of fluctuations of the operation temperature and the supplied voltage, or in the event of fluctuations of the transistor characteristics due to aging deterioration.

The aforementioned description describes an example where compensating operations are performed while the configuration of the delay circuit 10 is reconfigured to be the configuration as shown in FIG. 4B or 4C. However, the configuration of the delay circuit 10 can be reconfigured to be the configuration as shown in FIGS. 4A, 4B and 4C, and the transistor characteristics can be determined for each configuration. In this case, the characteristics can be measured for each different configuration of the delay monitor circuit 100, and the transistor substrate voltage can be controlled according to the logic represented in the following Table 3. In Table 3, "1" indicates a case where the delay time in the delay monitor circuit 100 is equal to or more than the reference value, while "0" indicates a case where it is less than the reference value, when the measurement is performed by reconfiguring the delay circuits 10 to be each of the configurations. Further, "+1" indicates a case where the substrate voltage should be modified in the forward bias direction, while "−1" indicates a case where the substrate voltage should be modified in the reverse bias direction, and "0" indicates a case where it should not be changed. Combinations which would not occur when the circuit is normally operated are not indicated in Table 3.

TABLE 3

| Standard inverter (FIG. 4A) | Configuration sensitive to nMOS (FIG. 4B) | Configuration sensitive to pMOS (FIG. 4C) | Substrate voltage for nMOS transistor (VPW) | Substrate voltage for pMOS transistor (VNW) |
|---|---|---|---|---|
| 0 | 0 | 0 | +1 | +1 |
| 0 | 0 | 1 | +1 | 0 |
| 0 | 1 | 0 | 0 | +1 |
| 1 | 0 | 1 | +1 | −1 |
| 1 | 1 | 0 | −1 | +1 |
| 1 | 1 | 1 | −1 | −1 |

As described above, in the present embodiment, information for variation compensation is stored in the registers 67a and 67b. Therefore, by updating the registers 67a and 67b at desired timing, it is possible to perform variation compensation which reflects the conditions (operation environment, aging deterioration, and the like) of the semiconductor chip at the desired timing. Regarding timing of automatically compensating variations in transistor characteristics, there are the following examples in addition to the aforementioned example.

(1) At Predetermined Time Intervals

The required substrate voltages are determined, and the values thereof are stored in the registers 67a and 67b, at predetermined time intervals. As the predetermined interval, it is possible to set arbitrary time interval, such as one month or one year.

(2) When Fluctuation of Operation Environment is Predicted

The substrate voltages required for compensating transistor characteristics is determined, and the values thereof are stored in the registers 67a, and 67b, in cases where fluctuation in the operation environment (temperature, voltage, and the like) is tried to be predicted and it is predicted that the operation environment may be fluctuated, during operations of integrated circuits. Further, the DA converters 69a and 69b are operated based on the values in the registers 67a and 67b.

(3) At Power-On

Upon power-on of the integrated circuit, the substrate voltages required for compensating transistor characteristics are determined, and the values of them are stored in the registers 67a and 67b. Hereinafter, the DA converters 69a and 69b are operated, based on the values in the registers 67a and 67b updated upon the power-on.

(4) At Product Test

During test after the manufacturing of the integrated circuit, the substrate voltages required for compensating transistor characteristics are determined, and the values of them are stored in the registers 67a and 67b. Hereinafter, the DA converters 69a and 69b are operated, based on the values in the registers 67a and 67b.

In the aforementioned example, the transistor substrate voltages are changed to compensate the variation in the transistor characteristics. However, the variation compensation method is not limited thereto. For example, it is also possible to adjust the clock frequency and the power supply voltage based on results of determination of transistor characteristics.

Further, in the aforementioned example, the delay monitor circuit 100 is composed of the delay circuits 10 described in the first embodiment. However, the delay monitor circuit can be composed of the delay circuits described in any one of the second to fourth embodiments or delay circuits in a sixth embodiment which is described later.

Further, in the aforementioned example, an example where inter-chip variations are automatically compensated is described, it is also possible to automatically compensate on-chip variations. In this case, the control circuit 65 controls the configurations of the delay circuits in the respective stages in such a way as to make a target stage have a configuration different from those of the other stages, as described in the first embodiment and the like. The control circuit 65 measures the characteristic of the transistors in the stage of interest, while changing over the target stage. Further, the control circuit 65 compensates the variation in the transistors based on the result of measurement.

3. Conclusion

As described above, the variation compensation circuit 150 according to the present embodiment is a variation compensation circuit for compensating variations in characteristics of transistors (circuit elements) in an integrated circuit. The variation compensation circuit 150 includes the delay monitor circuit (100), and the compensation circuit (63, 65, 67a to 67b, 69a to 69b) for compensating variations in transistor characteristics based on signal transmission delays determined by the delay monitor circuit. With this variation compensation circuit, it is possible to automatically compensate characteristic variations in the transistors which form the integrated circuit.

Sixth Embodiment

In the delay circuits described in the first to fourth embodiments, the pull-up circuit 2 is placed in a lower-voltage side with respect to the pMOS pass transistor 6, and the pull-down circuit 3 is placed in a higher-voltage side with respect to the nMOS pass transistor 7 in the first inversion logic gate. On the other hand, in a delay circuit according to the present embodiment, as shown in FIG. 13, in a first inversion logic gate, a pull-up circuit 2 is placed in a higher-voltage side with respect to a pMOS pass transistor 6, and a pull-down circuit 3 is placed in a lower-voltage side with respect to a nMOS pass transistor 7.

Figure 13A:
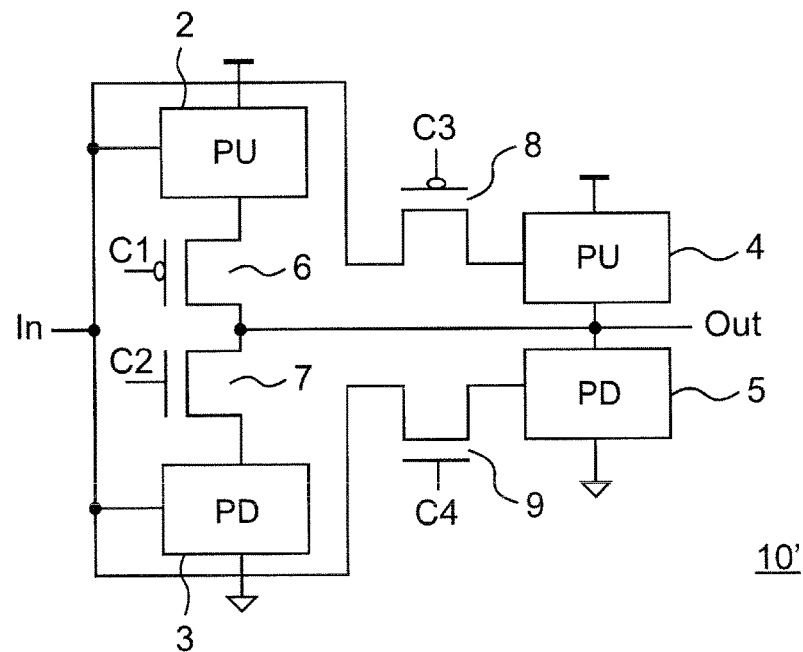
FIGS. 13A-13B are views showing a configuration of a delay circuit according to a sixth embodiment of the present invention.

Namely, as shown in FIG. 13A, the pMOS pass transistor 6 is connected in series, between the pull-up circuit 2 and the output end (Out) of the first inversion logic gate. Further, the nMOS pass transistor 7 is connected in series, between the pull-down circuit 3 and the output end (Out). With the circuit configuration as shown in FIG. 13A, the pull-up circuit 2 and the pull-down circuit 3 are less influenced by the transistor substrate voltages, so that logic inversion signals can be created with higher accuracy.

Figure 13B:
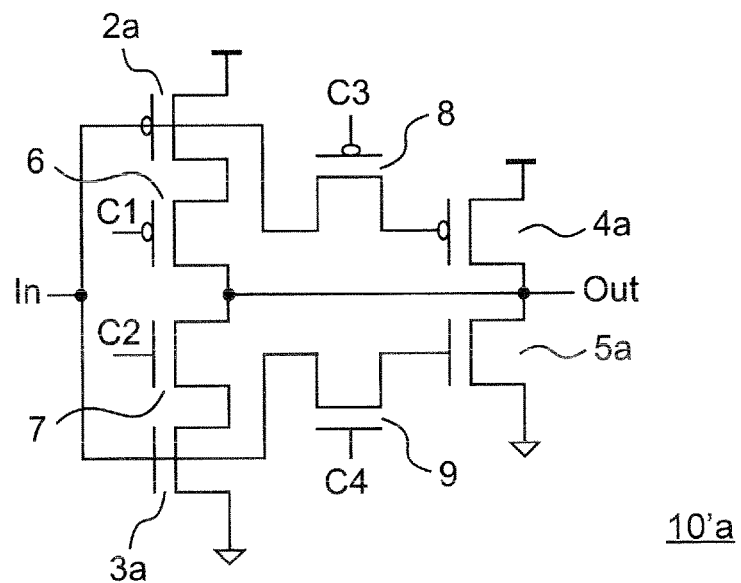

FIG. 13B shows an example of a simplest configuration of the pull-up circuit and the pull-down circuit, in the configuration as shown in FIG. 13A. In FIG. 13A, the pull-up circuits 2 and 4 and the pull-down circuits 3 and 5 are each a single pMOS transistor or a single nMOS transistor.

The relationship between the combinations of control signals C1, C2, C3 and C4 applied to the gates of the pass transistors 6 to 9 in the delay circuit 10', 10'a as shown in FIG. 13, and the characteristics of the delay circuit 10 which are provided by these respective combinations is the same as that as shown in Table 1.

Figure 14A:
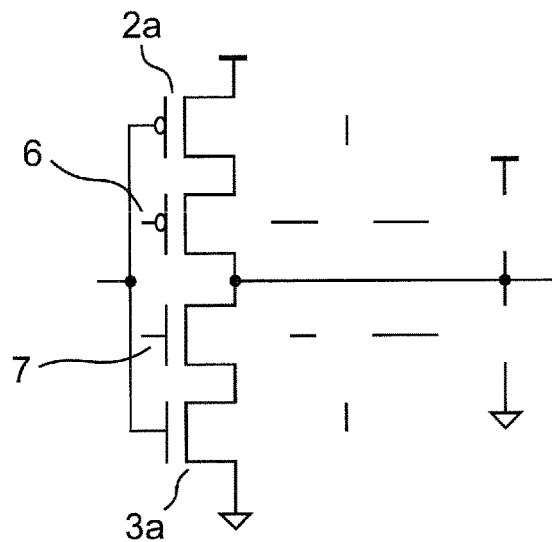
FIGS. 14A, 14B and 14C are views showing equivalent circuits of the delay circuit according to the sixth embodiment.
Figure 14B:
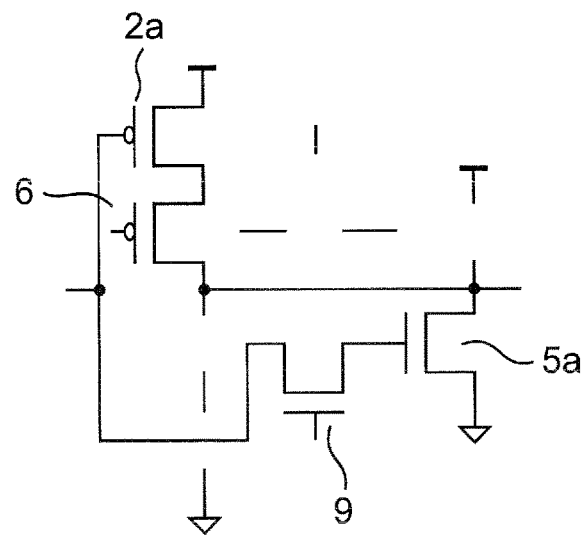
Figure 14C:
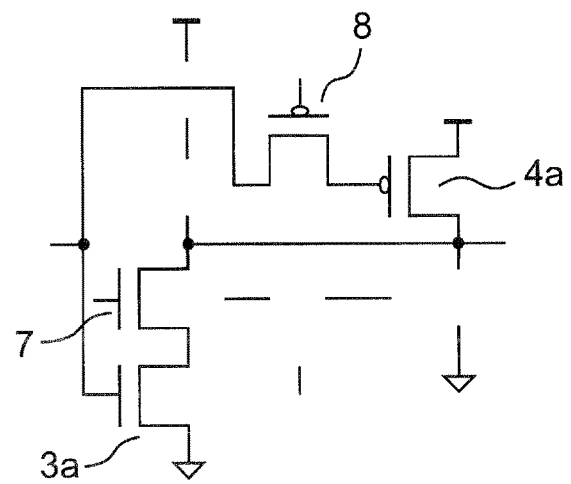

FIGS. 14A-14C are views showing equivalent circuits of reconfigured delay circuits obtained from the delay circuit 10a' as shown in FIG. 13B. FIG. 14A shows the configuration of the delay circuit which is reconfigured to be a standard inverter. FIG. 14B shows the configuration of the delay circuit which is reconfigured to be a configuration sensitive to the nMOS transistor. FIG. 14C shows the configuration of the delay circuit which is reconfigured to be a configuration sensitive to the pMOS transistor.

Figure 15:
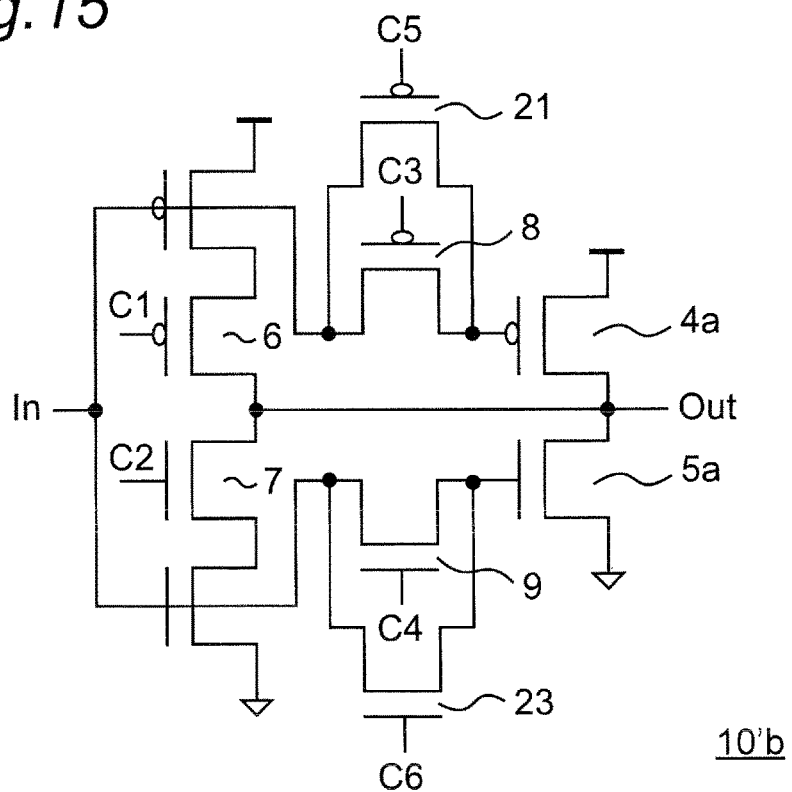
FIG. 15 is a view showing a configuration of an example of modification of the delay circuit according to the sixth embodiment.
Figure 16:
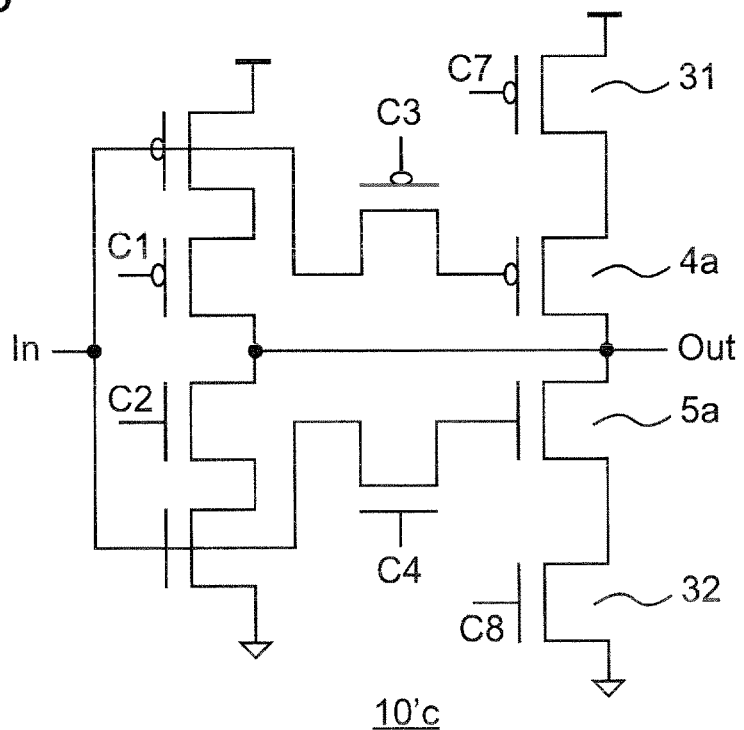
FIG. 16 is a view showing a configuration of another example of modification of the delay circuit according to the sixth embodiment.
Figure 17:
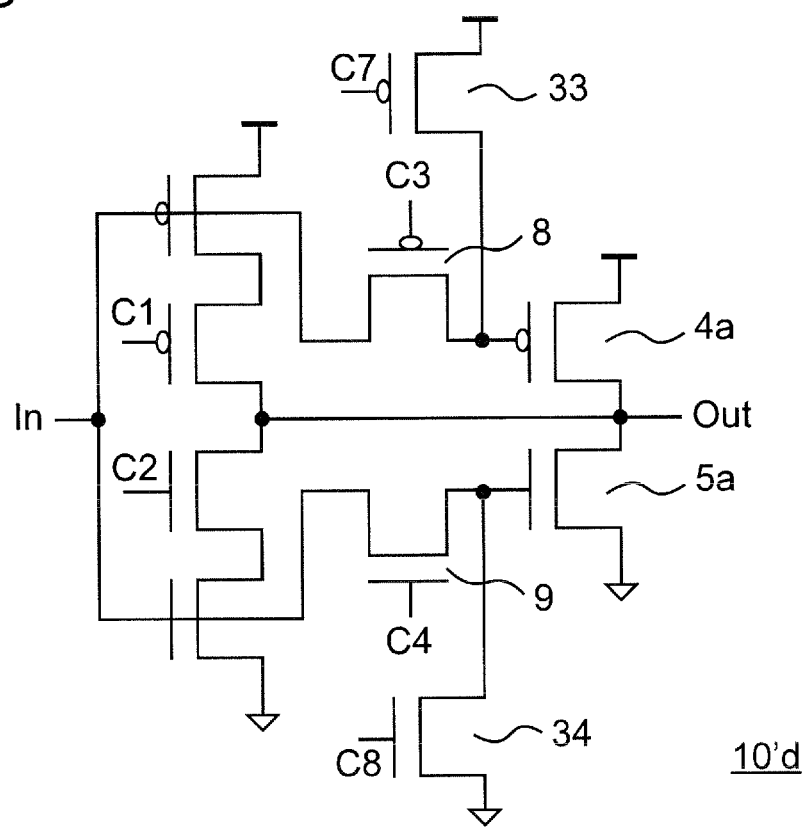
FIG. 17 is a view showing a configuration of yet another example of modification of the delay circuit according to the sixth embodiment.

FIGS. 15 to 17 show examples of modifications of the delay circuit 10'a as shown in FIG. 13B. FIG. 15 shows a configuration including a pMOS pass transistor 21 and an nMOS pass transistor 23 which are connected in parallel to the pMOS pass transistor 8 and the nMOS pass transistor 9, respectively, in the configuration of the delay circuit 10'a as shown in FIG. 13B. The relationship between the combinations of control signals C1, C2, C3, C4, C5 and C6 applied to the gates of the pass transistors 6 to 9, 21 and 23 in the delay circuit 10'b, and the characteristics of the delay circuit 10 which are provided by these respective combinations is the same as that as shown in Table 2. With this configuration, it is possible to evaluate on-chip variations for each pass transistor, similarly to the circuit as shown in FIG. 5 according to the second embodiment.

In the circuit as shown in FIG. 16, a pMOS pass transistor 31 is inserted between the power supply and the pMOS transistor 4a in the second inversion logic gate, in the delay circuit 10'a as shown in FIG. 13B. Further, an nMOS pass transistor 32 is inserted between the ground and the nMOS transistor 5a in the second inversion logic gate. With this circuit configuration, it is possible to prevent a leak current at the pMOS transistor 4a or the nMOS transistor 5a, similarly to the circuit as shown in FIG. 7A according to the third embodiment.

In the circuit as shown in FIG. 17, a pMOS pull-up transistor 33 is inserted between the power supply and the gate of the pMOS transistor 4a in the second inversion logic gate, in the delay circuit 10'a as shown in FIG. 13B. Further, an nMOS pull-down transistor 34 is inserted between the ground and the gate of the nMOS transistor 5a in the second inversion logic gate. With this circuit configuration, it is possible to prevent a leak current through the pMOS transistor 4a or the nMOS transistor 5a, similarly to the circuit as shown in FIG. 7B according to the third embodiment.

INDUSTRIAL APPLICABILITY

The present invention is useful in technology for evaluating variations in characteristics during manufacturing and development of all types of integrated circuits, such as ASIC, CPU, memory which are manufactured by CMOS techniques, and in various types of applied technology referring to the result of evaluating.

The invention claimed is:

1. A delay circuit which is reconfigurable and is included in a delay monitor circuit for measuring a delay in a signal transmission time in an integrated circuit, the delay circuit comprising:
   an input node for inputting an input signal;
   an output node for outputting an output signal;
   a first inversion circuit including a serial circuit which comprises a pull-up circuit adapted to connect a power supply potential to the output node when being turned on based on the input signal, and a pull-down circuit adapted to connect a ground potential to the output node when being turned on based on the input signal;
   a second inversion circuit including a serial circuit which comprises a pull-up circuit adapted to connect the power supply potential to the output node when being turned on based on the input signal, and a pull-down circuit adapted to connect the ground potential to the output node when being turned on based on the input signal;
   a first pass transistor connected in series to the pull-up circuit in the first inversion circuit, between the power supply potential and the output node;
   a second pass transistor connected in series to the pull-down circuit in the first inversion logic circuit, between the ground potential and the output node;
   a third pass transistor connected in series between the input node and an input of the pull-up circuit in the second inversion circuit; and
   a fourth pass transistor connected in series between the input node and an input of the pull-down circuit in the second inversion circuit,
   wherein a control signal applied to a gate of the third pass transistor controls the third pass transistor independently of a control signal applied to a gate of the fourth pass transistor, and wherein a delay characteristic of the reconfigurable delay circuit is changed by a combination of control signals applied to gates of the first to fourth pass transistors.

2. The delay circuit according to claim 1, wherein at least a fifth pass transistor is connected in parallel to the third pass transistor, and at least a sixth pass transistor is connected in parallel to the fourth pass transistor.

3. The delay circuit according to claim 1, further comprising
   a fifth pass transistor connected between the power supply potential and the pull-up circuit in the second inversion circuit, and
   a sixth pass transistor connected between the ground potential and the pull-down circuit in the second inversion circuit.

4. The delay circuit according to claim 1, further comprising
   a fifth pass transistor connected between the power supply potential and a control input of the pull-up circuit in the second inversion circuit, and
   a sixth pass transistor connected between the ground potential and a control input of the pull-down circuit in the second inversion circuit.

5. The delay circuit according to claim 1, wherein the combination of control signals include one or more of
   a combination of control signals for turning on the first and second pass transistors and for turning off the third and fourth pass transistors,
   a combination of control signals for turning on the first and fourth pass transistors and for turning off the second and third pass transistors, and a combination of control signals for turning on the second and third pass transistors and for turning off the first and fourth pass transistors.

6. The delay circuit according to claim 1, wherein the first pass transistor is connected in series between the power supply potential and the pull-up circuit in the first inversion circuit, and the second pass transistor is connected in series between the ground potential and the pull-down circuit in the first inversion circuit.

7. The delay circuit according to claim 1, wherein the first pass transistor is connected in series between the output node and the pull-up circuit in the first inversion circuit, and the second pass transistor is connected in series between the output node and the pull-down circuit in the first inversion circuit.

8. The delay circuit according to claim 1, wherein the pull-up circuit of the first inversion circuit, the pull-up circuit of the second inversion circuit, and the third pass transistor are each a pMOS transistor, and the pull-down circuit of the first inversion circuit, the pull-down circuit of the second inversion circuit, and the fourth pass transistor are each an nMOS transistor.

9. The delay circuit according to claim 1, further comprising:
multiple delay circuits connected in series to each other in multiple stages.

10. The delay circuit according to claim 9, wherein an output of the delay circuit in a last stage of the multiple stages is fed back to an input of the delay circuit in a first stage of the multiple stages.

11. The delay circuit according to claim 9, further comprising:
a compensation circuit for compensating a variation in the characteristics of circuit elements in an integrated circuit, based on a delay of signal transmission measured by the delay circuit.

12. The delay circuit according to claim 11, wherein the circuit elements are transistors, and the compensation circuit is adapted to compensate the characteristics of the transistors by changing a substrate voltage for the transistors based on the measured delay of signal transmission.

13. A method for measuring a variation in characteristics of circuit elements in an integrated circuit using the delay circuit according to claim 9,
setting the control signals for each stage in such a way as to make the delay circuit in a specific stage have a configuration different from configurations of the delay circuits in the other stages than the specific stage, and applying the set control signals to the pass transistors;
measuring an output of the delay monitor circuit, with the control signals being applied to the pass transistors;
repeating the setting the control signals and the measuring an output of the delay circuit while sequentially shifting the specific stage; and
measuring a variation in the characteristics of the circuit elements in a chip on which the integrated circuit is formed, based on a result of the measurement obtained in the repeating.

14. A method for measuring a variation in characteristics of circuit elements among semiconductor chips on each of which an integrated circuit is formed using the delay circuit according to claim 9,
the method comprising:
setting the control signals for each stage in such a way as to make the delay circuits in all the stages have the same configuration and applying the set control signals to the pass transistors;
measuring an output of the delay circuit, with the control signals being applied to the pass transistors; and measuring a variation in the characteristics of the circuit elements, among the chips on each of which the integrated circuit is formed, based on a result of the measurement obtained in measuring an output of the delay circuit.

15. A method for measuring a variation in characteristics of circuit elements in an integrated circuit using the delay circuit according to claim 2, wherein
the delay circuit comprises multiple delay circuits connected in series to each other in multiple stages,
the method comprising:
setting the control signals for each stage in such a way as to make the delay circuit in a specific stage have a configuration different from configurations of the delay circuits in the other stages than the specific stage, and applying the set control signals to the pass transistors;
measuring an output of the delay circuit, with the control signals being applied to the pass transistors;
repeating the setting the control signals and the measuring an output of the delay circuit, while sequentially shifting the specific stage; and
measuring a variation in the characteristics of the circuit elements in the chip on which the integrated circuit is formed, based on a result of the measurement obtained in the repeating,
the measuring an output of the delay circuit includes
turning on the third pass transistor while turning off the fifth transistor, and measuring an output of the delay circuit, for the specific stage,
turning off the third pass transistor while turning on the fifth pass transistor, and measuring the output of the delay circuit, for the specific stage, and
calculating a difference between a result of the measurement obtained with the third pass transistor turned on and the fifth pass transistor turned off and a result of the measurement obtained with the third pass transistor turned off and the fifth pass transistor turned on.

16. A method for measuring a variation in characteristics of circuit elements in an integrated circuit using the delay circuit according to claim 2, wherein
the delay circuit comprises multiple delay circuits connected in series to each other in multiple stages,
the method comprising:
setting the control signals for each stage in such a way as to make the delay circuit in a specific stage have a configuration different from configurations of the delay circuits in the other stages than the specific stage, and applying the set control signals to the pass transistors;
measuring an output of the delay circuit, with the control signals being applied to the control signals to the pass transistors;
repeating the setting the control signals and applying the set control signals and the measuring an output of the delay circuit, while sequentially shifting the specific stage; and
measuring a variation in the characteristics of the circuit elements in a chip on which the integrated circuit is formed, based on a result of the measurement obtained in the repeating;
the measuring an output of the delay circuit includes
turning on the fourth pass transistor while turning off the sixth transistor, and measuring an output of the delay circuit, for the specific stage,
turning off the fourth pass transistor while turning on the sixth pass transistor, and measuring the output of the delay circuit, for the specific stage, and calculating a difference between a result of the measurement obtained with the fourth pass transistor turned on and the sixth pass transistor turned off and a result of the measurement obtained with the fourth pass transistor turned off and the sixth pass transistor turned on.

17. The method according to claim 13, further comprising:
compensating the characteristics of the circuit elements based on the measured variation.

18. The method according to claim 14, further comprising:
compensating the characteristics of the circuit elements based on the measured variation.

19. The method according to claim 15, further comprising:
compensating the characteristics of the circuit elements based on the measured variation.

20. The method according to claim 16, further comprising:
compensating the characteristics of the circuit elements based on the measured variation.

* * * * *